(12) United States Patent
Baba et al.

(10) Patent No.: US 11,581,622 B2
(45) Date of Patent: Feb. 14, 2023

(54) TRANSMISSION LINE AND ELECTRONIC DEVICE

(71) Applicant: Murata Manufacturing Co., Ltd., Nagaokakyo (JP)

(72) Inventors: Takahiro Baba, Nagaokakyo (JP); Yuya Dokai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 34 days.

(21) Appl. No.: 16/843,952

(22) Filed: Apr. 9, 2020

(65) Prior Publication Data

US 2020/0235450 A1 Jul. 23, 2020

Related U.S. Application Data

(63) Continuation of application No. 16/379,846, filed on Apr. 10, 2019, now Pat. No. 10,673,113, which is a (Continued)

(30) Foreign Application Priority Data

| Sep. 26, 2014 | (JP) | 2014-196775 |
| Oct. 2, 2014 | (JP) | 2014-203835 |

(51) Int. Cl.
| *H01P 3/08* | (2006.01) |
| *H05K 1/02* | (2006.01) |
| *H05K 1/18* | (2006.01) |

(52) U.S. Cl.
CPC ............... *H01P 3/08* (2013.01); *H01P 3/088* (2013.01); *H05K 1/0245* (2013.01); *H05K 1/0251* (2013.01); *H05K 1/181* (2013.01)

(58) Field of Classification Search
CPC .. H01P 3/088; H01P 3/085; H01P 3/08; H01P 3/082; H01P 3/081; H05K 1/025; H05K 1/0251; H05K 1/181
See application file for complete search history.

(56) References Cited

U.S. PATENT DOCUMENTS

| 5,406,235 | A | * | 4/1995 | Hayashi | H01P 1/203 333/204 |
| 6,008,534 | A | * | 12/1999 | Fulcher | H01L 23/66 257/691 |

(Continued)

FOREIGN PATENT DOCUMENTS

| CN | 102783259 A | 11/2012 |
| JP | 2002-185219 A | 6/2002 |

OTHER PUBLICATIONS

Picking Prepregs For Peak Performance, Feb. 8, 2012, Microwave Journal, pp. 3-6. https://www.microwavejournal.com/blogs/1-rog-blog/post/16907-picking-prepregs-for-peak-performance (Year: 2012).*

(Continued)

*Primary Examiner* — Stephen E. Jones
(74) *Attorney, Agent, or Firm* — Keating & Bennett, LLP

(57) ABSTRACT

In a transmission line, a first ground conductor pattern and a second ground conductor pattern are connected through a first interlayer connecting conductor, and the first ground conductor pattern and a third ground conductor pattern are connected through a second interlayer connecting conductor. A first signal conductor pattern includes a first bypassing pattern portion that bypasses the first interlayer connecting conductor, and a second signal conductor pattern includes a second bypassing pattern portion that bypasses the second interlayer connecting conductor. Bypassing directions of the first bypassing pattern portion and the second bypassing pattern portion are opposite to each other.

14 Claims, 27 Drawing Sheets

Related U.S. Application Data continuation of application No. 15/456,694, filed on Mar. 13, 2017, now Pat. No. 10,305,156, which is a continuation of application No. PCT/JP2015/076420, filed on Sep. 17, 2015.

(56) References Cited

U.S. PATENT DOCUMENTS

| | | | | |
|---|---|---|---|---|
| 7,755,445 | B2* | 7/2010 | Dutta | H01P 3/084 |
| | | | | 333/1 |
| 8,525,613 | B2* | 9/2013 | Kato | H01P 3/08 |
| | | | | 333/33 |
| 2006/0131611 | A1* | 6/2006 | Kaluzni | H01L 23/66 |
| | | | | 257/206 |
| 2013/0057365 | A1 | 3/2013 | Mizushima et al. | |
| 2014/0240056 | A1* | 8/2014 | Isom | H01P 5/10 |
| | | | | 333/26 |

OTHER PUBLICATIONS

Machine Translation of JP2002185219A (Year: 2002).*
Baba et al., "Transmission Line and Electronic Device", U.S. Appl. No. 16/379,846, filed Apr. 10, 2019.
Official Communication issued in corresponding Chinese Patent Application No. 201910850185.8, dated Jan. 19, 2021.

* cited by examiner

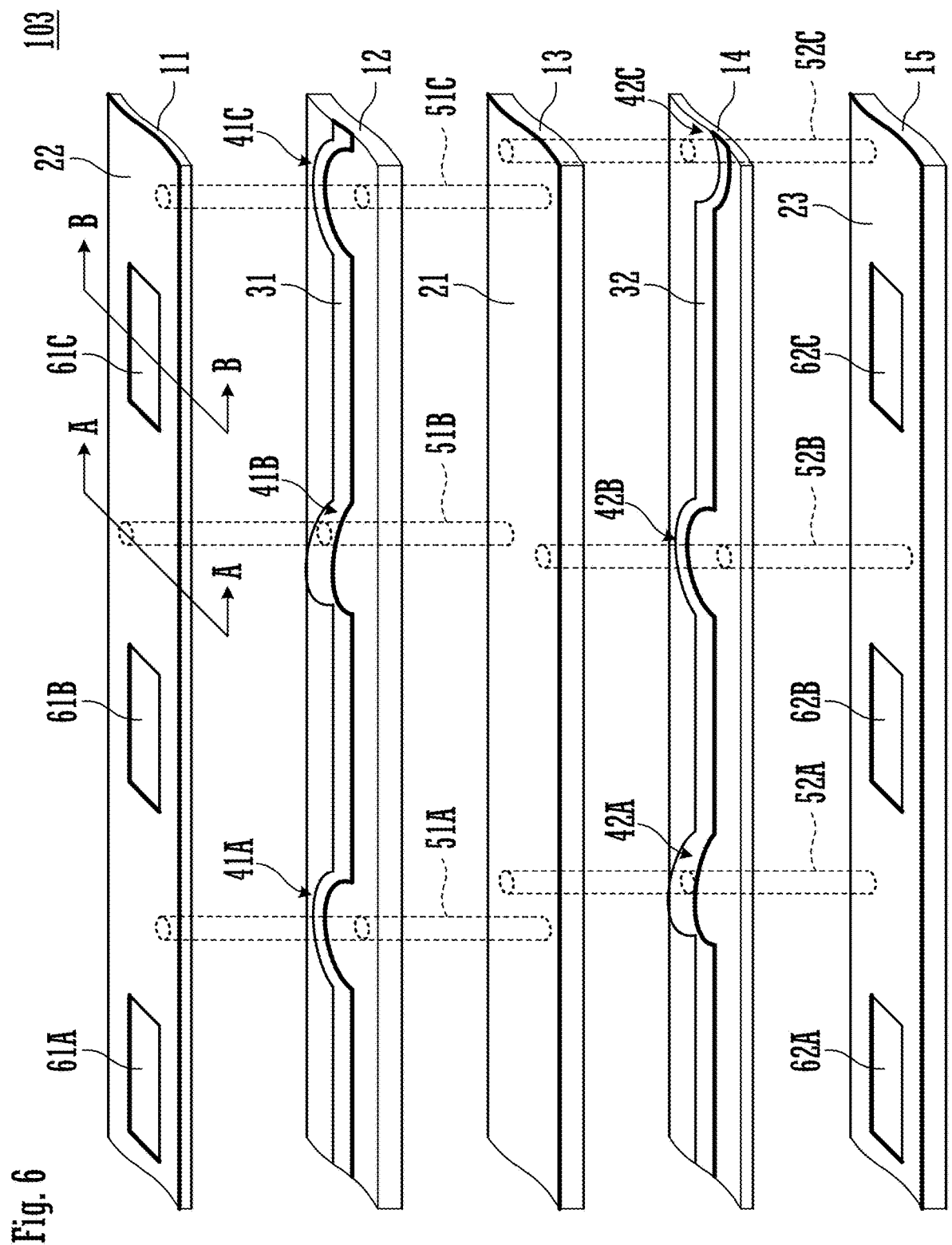

TRANSMISSION LINE AND ELECTRONIC DEVICE

CROSS REFERENCE TO RELATED APPLICATIONS

This application claims the benefit of priority to Japanese Patent Application No. 2014-196775 filed on Sep. 26, 2014 and Japanese Patent Application No. 2014-203835 filed on Oct. 2, 2014, and is a Continuation Application of PCT Application No. PCT/JP2015/076420 filed on Sep. 17, 2015. The entire contents of each application are hereby incorporated herein by reference.

BACKGROUND OF THE INVENTION

1. Field of the Invention

The present invention relates to a transmission line that transmits a plurality of high-frequency signals therethrough, and an electronic device including the transmission line.

2. Description of the Related Art

Various transmission lines for transmitting high-frequency signals therethrough have been proposed so far. For example, Japanese Patent No. 4962660 discloses a transmission line with a stripline structure. The transmission line disclosed in Japanese Patent No. 4962660 includes an elongated multilayer insulating body extending in a transmission direction of the high-frequency signals, a signal line, a first ground conductor, and a second ground conductor. The signal line is located inside the multilayer insulating body. The first ground conductor and the second ground conductor are arranged in a state sandwiching the signal line in a thickness direction of the multilayer insulating body (i.e., in a lamination direction of insulator layers). Furthermore, the first ground conductor and the second ground conductor are connected to each other through a plurality of via hole conductors (interlayer connecting conductors) that are arrayed along the signal line. Thus, the transmission line of the stripline structure sandwiching the signal line between the first ground conductor and the second ground conductor is provided.

In trying to arrange a plurality of transmission lines of the structure disclosed in Japanese Patent No. 4962660 close to each other in, e.g., a communication device, a plurality of signal lines may be arrayed inside one multilayer insulating body in one example. In such an example, it is conceivable to arrange the signal lines with a spacing held between the adjacent signal lines in a direction (width direction of the multilayer insulating body) that is orthogonal to both the thickness direction of the multilayer insulating body and the signal transmission direction.

In other words, when the transmission lines of the structure disclosed in Japanese Patent No. 4962660 are arrayed in the width direction of the multilayer insulating body and the multilayer insulating body is formed into an integral unit with the interlayer connecting conductor arranged between the adjacent signal lines, unwanted coupling between the adjacent signal lines is suppressed with the presence of the interlayer connecting conductor.

The above-described configuration of arranging the interlayer connecting conductors between the adjacent signal lines has the following problems.

(1) When the pitch of the interlayer connecting conductors arranged between the adjacent signal lines is set to a large value, or when the interlayer connecting conductors are omitted, unwanted coupling between the signal lines is more apt to occur. On the other hand, when the pitch of the interlayer connecting conductors is set to a small value, a capacitance generated between the signal line and the interlayer connecting conductor is increased, and the desired characteristic impedance as the transmission line is hard to realize.

(2) As the width of the multilayer insulating body is reduced, the capacitance generated between the signal line and the interlayer connecting conductor is increased, and the desired characteristic impedance as the transmission line is harder to realize.

(3) Because the interlayer connecting conductors have to be arranged between the signal lines, the width of the multilayer insulating body is inevitably increased.

For the reasons described above, the width of the transmission line is increased.

SUMMARY OF THE INVENTION

Preferred embodiments of the present invention provide a transmission line that includes a plurality of signal conductors in one multilayer insulating body, that significantly reduces or prevents unwanted coupling between the signal conductors, and that has a smaller size.

According to a preferred embodiment of the present invention, a transmission line includes a multilayer insulating body that includes a plurality of insulator layers laminated on one another, a conductor pattern that is located inside the multilayer insulating body along the insulator layers, and an interlayer connecting conductor that is located inside the multilayer insulating body, wherein the conductor pattern includes a second ground conductor pattern, a first ground conductor pattern, and a third ground conductor pattern, which are successively arranged along different insulator layers among the plurality of insulator layers, the conductor pattern further includes a first signal conductor pattern arranged in or on a layer between the first ground conductor pattern and the second ground conductor pattern, and a second signal conductor pattern arranged in or on a layer between the first ground conductor pattern and the third ground conductor pattern, the first ground conductor pattern, the second ground conductor pattern, and the third ground conductor pattern each have a larger width than the first signal conductor pattern and the second signal conductor pattern, the interlayer connecting conductor includes a first interlayer connecting conductor that establishes interlayer connection between the first ground conductor pattern and the second ground conductor pattern, and a second interlayer connecting conductor that establishes interlayer connection between the first ground conductor pattern and the third ground conductor pattern, the first signal conductor pattern includes a first bypassing pattern portion that bypasses the first interlayer connecting conductor, and the second signal conductor pattern includes a second bypassing pattern portion that bypasses the second interlayer connecting conductor.

With the features described above, the first signal conductor pattern, the first ground conductor pattern, and the second ground conductor pattern define and function as a first transmission line, and the second signal conductor pattern, the first ground conductor pattern, and the third ground conductor pattern define and function as a second transmission line.

Furthermore, the first ground conductor pattern is interposed between the first signal conductor pattern and the second signal conductor pattern to establish shielding against an electric field between the first signal conductor pattern and the second signal conductor pattern. Accordingly, unwanted coupling between the first signal conductor pattern and the second signal conductor pattern is significantly reduced or prevented.

Moreover, since the second ground conductor pattern and the third ground conductor pattern are held at the same potential as that of the first ground conductor pattern with the presence of the first interlayer connecting conductor and the second interlayer connecting conductor, the potential of the first ground conductor pattern is stabilized. Accordingly, cross talk (signal leakage) between the first transmission line and the second transmission line is also significantly reduced or prevented, the cross talk being caused due to fluctuations in potential of the first ground conductor pattern.

The first bypassing pattern portion and the second bypassing pattern portion are spaced away from each other in a direction perpendicular or substantially perpendicular to an extending direction of the first signal conductor pattern and the second signal conductor pattern. Accordingly, unwanted coupling between the first bypassing pattern portion and the second bypassing pattern portion through a nearby external space laterally of the multilayer insulating body is significantly reduced or prevented.

In addition, even with the multilayer insulating body having a small width (the width being taken in the direction perpendicular or substantially perpendicular to the extending direction of the first signal conductor pattern and the second signal conductor pattern), since the first interlayer connecting conductor and the second interlayer connecting conductor are able to be formed together with the first signal conductor pattern and the second signal conductor pattern, the transmission line having a small line width is able to be provided.

Preferably, bypassing directions of the first bypassing pattern portion and the second bypassing pattern portion, which are positioned close to each other, are opposite when viewed in a lamination direction of the insulator layers.

With the feature described above, even when an elongated transmission line is provided, the potentials of the first ground conductor pattern, the second ground conductor pattern, and the third ground conductor pattern are stabilized in different portions of the transmission line in a signal transmission direction, and the unwanted coupling between the first signal conductor pattern and the second signal conductor pattern is significantly reduced or prevented. Furthermore, it is possible to significantly reduce or prevent uneven distribution of the conductor patterns in the direction perpendicular or substantially perpendicular to the extending direction of the first signal conductor pattern and the second signal conductor pattern, the uneven distribution being caused due to the presence of the bypassing pattern portions. As a result, symmetry with a symmetrical axis being the extending direction of the first signal conductor pattern and the second signal conductor pattern is able to be maintained.

Preferably, the first interlayer connecting conductor includes a plurality of the first interlayer connecting conductors, the first bypassing pattern portion includes a plurality of the first bypassing pattern portions, and bypassing directions of the first bypassing pattern portions are alternately reversed with respect to an extending direction of the first signal conductor pattern.

With the features described above, deformation of the multilayer insulating body is able to be significantly reduced or prevented in a process of forming the multilayer insulating body. Furthermore, it is possible to significantly reduce or prevent uneven distribution of the conductor patterns in the direction perpendicular or substantially perpendicular to the extending direction of the first signal conductor pattern, the uneven distribution being caused due to the presence of the bypassing pattern portions. As a result, symmetry with a symmetrical axis that extends along the extending direction of the first signal conductor pattern is able to be maintained.

Preferably, a position at which the first interlayer connecting conductor is located is deviated in a direction opposite to a bypassing direction of the first bypassing pattern portion by a predetermined distance from a center of the first signal conductor pattern in a width direction thereof.

With the feature described above, a predetermined spacing is able to be secured between the first interlayer connecting conductor and the first signal conductor pattern in a plane direction. As a result, the characteristic impedance of the first bypassing pattern portion is able to be maintained at a predetermined value. Furthermore, distances through which the first bypassing pattern portion is deviated for the bypassing are able to be significantly reduced, and continuity of the characteristic impedance of the transmission line is able to be ensured more easily. Hence, an increase in dimension of the multilayer insulating body in its width direction is able to be significantly reduced or prevented.

Preferably, the second ground conductor pattern includes a plurality of first openings at positions overlapping the first signal conductor pattern when viewed in a lamination direction of the insulator layers, and that are periodically arranged in an extending direction of the first signal conductor pattern, and the first interlayer connecting conductor is arranged between two adjacent first openings among the plurality of first openings.

With the features described above, since a capacitance generated between the first signal conductor pattern and the second ground conductor pattern is significantly reduced with the presence of the first openings, the thickness of the multilayer insulating body is able to be reduced correspondingly. In addition, since the first interlayer connecting conductor is located between two adjacent first openings among the plurality of first openings, the first interlayer connecting conductor is able to be formed easily.

Preferably, the first signal conductor pattern is arranged at a position that is located closer to the second ground conductor pattern than to the first ground conductor pattern in the lamination direction.

With the feature described above, the strength of an electric field generated between the first signal conductor pattern and the first ground conductor pattern and the strength of an electric field generated between the first signal conductor pattern and the second ground conductor pattern are equalized, and current concentration is moderated. This results in a lower loss.

Preferably, the third ground conductor pattern includes a plurality of second openings at positions overlapping the second signal conductor pattern when viewed in the lamination direction of the insulator layers, and that are periodically arranged in an extending direction of the second signal conductor pattern, and the second interlayer connecting conductor is arranged between two adjacent second openings among the plurality of second openings.

With the features described above, since a capacitance generated between the second signal conductor pattern and the third ground conductor pattern is significantly reduced or prevented, the thickness of the multilayer insulating body is able to be further reduced correspondingly. In addition, since the second interlayer connecting conductor is arranged between two adjacent second openings among the plurality of second openings, the second interlayer connecting conductor is able to be formed easily.

Preferably, the second signal conductor pattern is arranged at a position that is located closer to the third ground conductor pattern than to the first ground conductor pattern in the lamination direction.

With the feature described above, the strength of an electric field generated between the second signal conductor pattern and the first ground conductor pattern and the strength of an electric field generated between the second signal conductor pattern and the third ground conductor pattern are equalized, and current concentration is moderated. This results in a lower loss.

Preferably, positions of the first openings and positions of the second openings are different from each other by a half-period, a bypassing direction of the first bypassing pattern portion is a first direction with respect to an extending direction of the first signal conductor pattern when viewed in the lamination direction, and a bypassing direction of the second bypassing pattern portion is a second direction with respect to an extending direction of the second signal conductor pattern when viewed in the lamination direction.

With the features described above, since the first openings and the second openings are spaced apart from each other in the extending direction of the first signal conductor pattern and the second signal conductor pattern, unwanted coupling between the first and second signal conductor patterns is significantly reduced or prevented.

Preferably, the multilayer insulating body includes a plurality of first insulator layers each having a first dielectric constant and a plurality of second insulator layers each having a second dielectric constant larger than the first dielectric constant, and the first insulator layers are arranged in a distributed way in a lamination direction of the insulator layers.

With the features described above, stress strain caused due to differences in physical properties between the insulator layer having a relatively low dielectric constant and the insulator layer having a relatively high dielectric constant are able to be distributed. As a result, peeling-off between two types of the insulator layers having different dielectric constants is harder to occur. Moreover, since the capacitance between the signal conductor pattern and the ground conductor pattern are able to be reduced to a predetermined value, the transmission line is able to have a smaller thickness.

Preferably, the first interlayer connecting conductor and the second interlayer connecting conductor, which are closest to each other, are spaced apart from each other in an extending direction of the first signal conductor pattern.

With the feature described above, concentration of the interlayer connecting conductors is moderated (namely, the interlayer connecting conductors are arranged in a distributed way in a plane direction). As a result, the thickness of the multilayer insulating body in the lamination direction after the lamination is able to be held uniform more easily.

Preferably, the first interlayer connecting conductor defines, between two adjacent first openings among the plurality of first openings, a first interlayer connecting conductor group including the plurality of first interlayer connecting conductors that are arrayed in an extending direction of the first signal conductor pattern, and the first bypassing pattern portion bypasses the first interlayer connecting conductor group in a lump.

With the features described above, since the first ground conductor pattern is electrically conducted to the second ground conductor pattern through the first interlayer connecting conductor group, the first ground conductor pattern and the second ground conductor pattern are held at an electrically more stable potential. Moreover, since the first interlayer connecting conductor group is arranged laterally of the first signal conductor pattern, an effect of shielding the first signal conductor pattern is able to be further obtained in a lateral direction with respect to the transmission direction.

Preferably, the first ground conductor pattern includes a plurality of first ground conductor patterns that are provided respectively in a plurality of layers, a third signal conductor pattern is arranged between the first ground conductor patterns, and the first ground conductor patterns each have a larger width than the third signal conductor pattern.

With the features described above, a three-core transmission line including the first signal conductor pattern, the second signal conductor pattern, and one third signal conductor pattern is provided. In addition, a multi-core transmission line including four or more cores, namely including the first signal conductor pattern, the second signal conductor pattern, and the plurality of third signal conductor patterns, is also provided.

Preferably, a joining pattern electrically conducted to the conductor pattern is provided at a lower surface of the multilayer insulating body, the lower surface being parallel or substantially parallel to the plurality of insulator layers.

With the feature described above, the transmission line is able to be mounted to a circuit board as with other surface-mounted components that are able to be surface-mounted to the circuit board. In other words, a special assembly step or a special mounting (attaching) step dedicated for the transmission line is no longer required.

According to another preferred embodiment of the present invention, there is provided an electronic device including a transmission line according to one of the various preferred embodiments of the present invention described above, and a circuit board, wherein the transmission line is surface-mounted to the circuit board together with other surface-mounted components.

With the features described above, a thickness and a size of the circuit board to which the surface-mounted components, including the transmission line, are mounted is able to be reduced, and the electronic device having a smaller size is able to be provided.

Thus, various preferred embodiments of the present invention provide not only transmission lines that includes a plurality of signal conductors in one multilayer insulating body, that significantly reduce or prevent unwanted coupling between the signal conductors, and that have a smaller size, but also electronic devices including the transmission lines.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is an exploded perspective view of a transmission line according to a third preferred embodiment of the present invention.

DETAILED DESCRIPTION OF THE PREFERRED EMBODIMENTS

Figure 1:
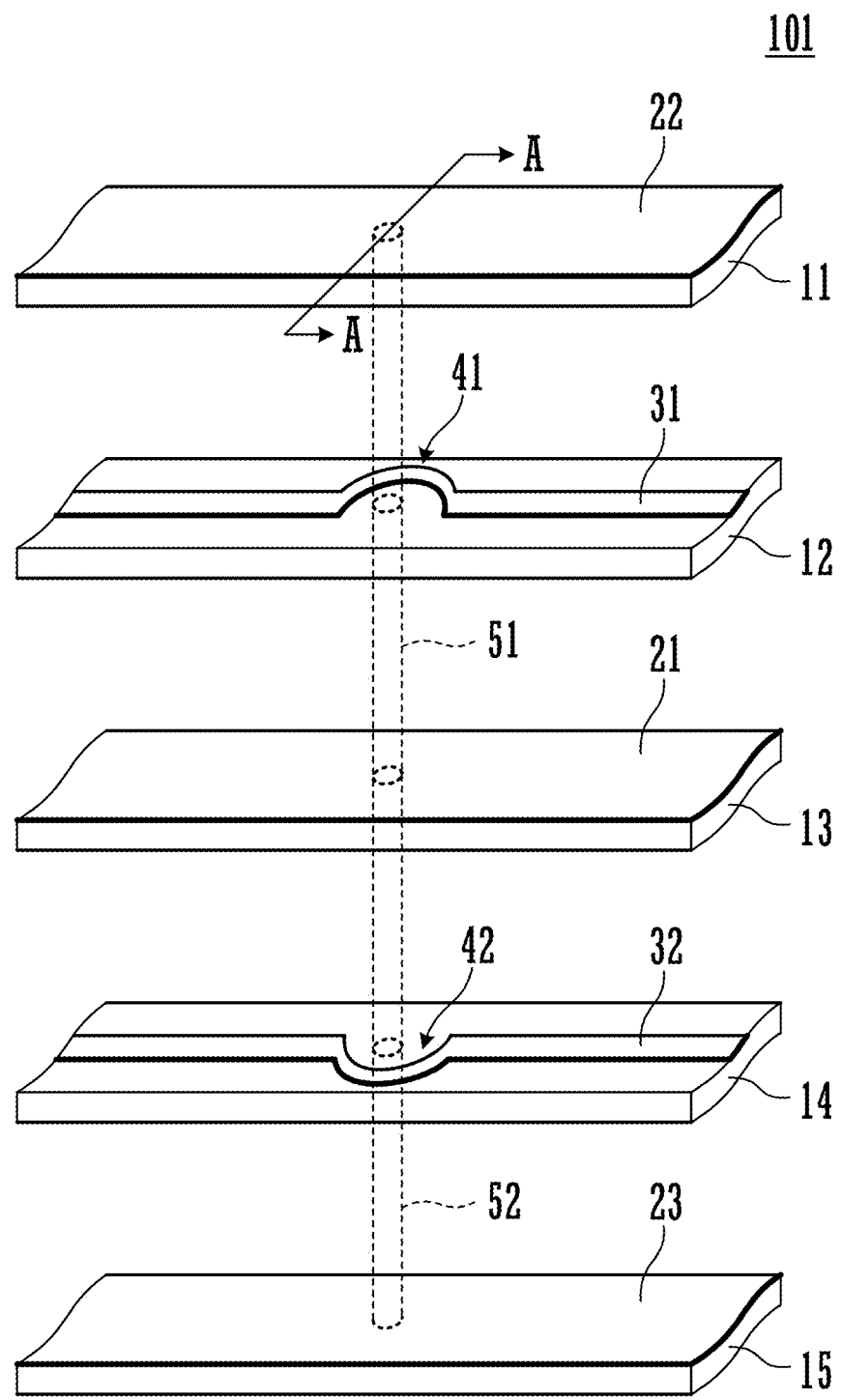
FIG. 1 is an exploded perspective view of a transmission line according to a first preferred embodiment of the present invention.

Preferred embodiments of the present invention will be described below in connection with several practical examples by referring to the drawings. In the drawings, the same components or portions are denoted by the same reference signs. While the preferred embodiments are described separately for the sake of convenience in consideration of ease of explanation and understanding of key points, portions of the configurations described in the different preferred embodiments can be optionally replaced or combined with each other. In second and subsequent preferred embodiments, matters common to those in a first preferred embodiment are omitted, and only different points are described. In particular, description of similar advantageous effects obtained with similar configurations is not repeated for each of the preferred embodiments.

First Preferred Embodiment

Figure 2:
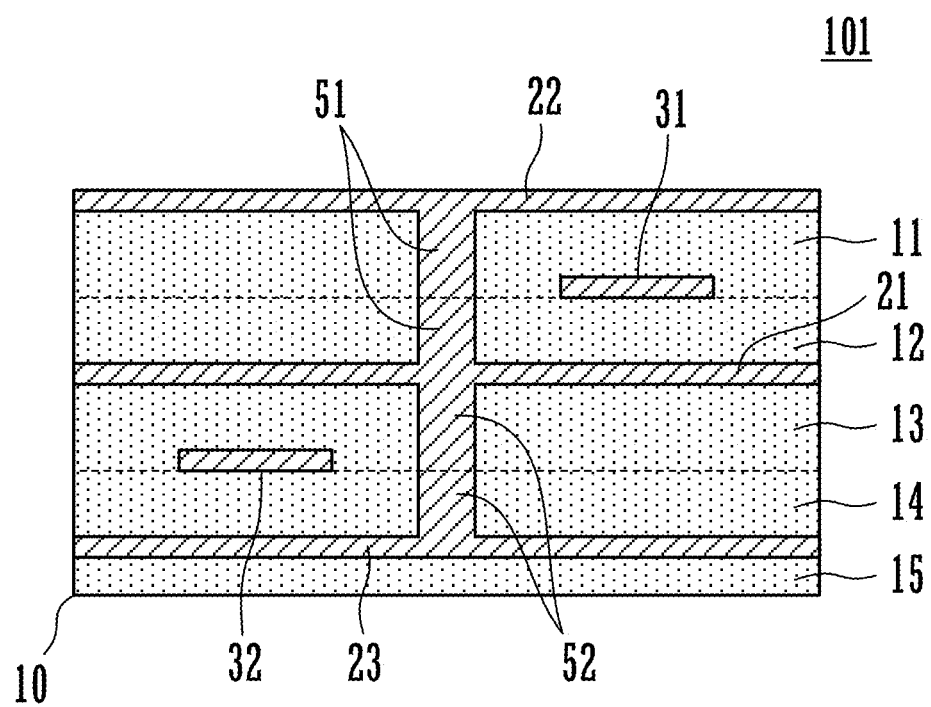
FIG. 2 is a sectional view of the transmission line, the view being taken along a line A-A in FIG. 1.

FIG. 1 is an exploded perspective view of a transmission line 101 according to a first preferred embodiment of the present invention. FIG. 2 is a sectional view of the transmission line 101, the view taken along a line A-A in FIG. 1.

The transmission line 101 includes a multilayer insulating body 10 in which insulator layers 11, 12, 13, 14 and 15 are laminated, conductor patterns that are located inside the multilayer insulating body 10 along the insulator layers 11, 12, 13, 14 and 15, and interlayer connecting conductors 51 and 52 that are located inside the multilayer insulating body 10.

The conductor patterns include a first ground conductor pattern 21 disposed on an upper surface of the insulator layer 13, a second ground conductor pattern 22 disposed on an upper surface of the insulator layer 11, and a third ground conductor pattern 23 disposed on an upper surface of the insulator layer 15.

The conductor patterns further include a first signal conductor pattern 31 arranged on the insulator layer 12, and a second signal conductor pattern 32 arranged on the insulator layer 14. The first signal conductor pattern 31 is arranged between the first ground conductor pattern 21 and the second ground conductor pattern 22. The second signal conductor pattern 32 is arranged between the first ground conductor pattern 21 and the third ground conductor pattern 23.

The interlayer connecting conductors includes a first interlayer connecting conductor 51 that establishes interlayer connection between the first ground conductor pattern 21 and the second ground conductor pattern 22, and a second interlayer connecting conductor 52 that establishes interlayer connection between the first ground conductor pattern 21 and the third ground conductor pattern 23. As shown in FIG. 2, the first interlayer connecting conductor 51 is provided on or in each of the insulator layers 11 and 12, and the second interlayer connecting conductor 52 is provided on or in each of the insulator layers 13 and 14.

The first signal conductor pattern 31 includes a first bypassing pattern portion 41 that bypasses the first interlayer connecting conductor 51, and the second signal conductor pattern 32 includes a second bypassing pattern portion 42 that bypasses the second interlayer connecting conductor 52.

The first bypassing pattern portion 41 and the second bypassing pattern portion 42 are positioned close to each other, and bypassing directions of the first bypassing pattern portion 41 and the second bypassing pattern portion 42 are opposite when viewed in a lamination direction of the insulator layers 11 to 15.

With the configuration described above, a first transmission line with a stripline structure is defined by the first signal conductor pattern 31, the first ground conductor pattern 21, and the second ground conductor pattern 22. Furthermore, a second transmission line with a stripline structure is defined by the second signal conductor pattern 32, the first ground conductor pattern 21, and the third ground conductor pattern 23. Taking into account members other than conductors as well, the insulator layers 11 and 12, each defining and functioning as a dielectric and a support layer, are also components of the first transmission line together with the first signal conductor pattern 31, the first ground conductor pattern 21, and the second ground conductor pattern 22. Similarly, the insulator layers 13 and 14 are also components of the second transmission line together with the second signal conductor pattern 32, the first ground conductor pattern 21, and the third ground conductor pattern 23.

The insulator layers 11 to 15 are each, for example, an insulator sheet portion of a single-sided copper-bonded insulator sheet including a copper foil that is bonded to one side of the sheet. The insulator sheet is a sheet made of, e.g., a liquid crystal polymer (LCP). Because the liquid crystal polymer has a low dielectric constant, a capacitance component of the line is able to be significantly reduced even when the signal conductor pattern and the ground conductor pattern are positioned close to each other. Furthermore, since dielectric loss tangent is also low, a transmission loss is significantly reduced or prevented. Moreover, because temperature dependency of the dielectric loss tangent is low, characteristic change caused due to environmental change is able to be significantly reduced or prevented. The above-described various conductor patterns are each formed preferably by patterning the copper foil bonded to the insulator sheet, for example. The multilayer insulating body 10 is formed preferably by placing the plurality of insulator sheets one above another, and by press-bonding the insulator sheets together under heating, for example.

Since the first ground conductor pattern 21 is interposed between the first signal conductor pattern 31 and the second signal conductor pattern 32 to establish shielding against an electric field between the first signal conductor pattern 31 and the second signal conductor pattern 32, unwanted coupling between the first signal conductor pattern 31 and the second signal conductor pattern 32 is significantly reduced or prevented.

Since the second ground conductor pattern 22 and the third ground conductor pattern 23 are held at the same potential as that of the first ground conductor pattern 21 with the presence of the first interlayer connecting conductor 51 and the second interlayer connecting conductor 52, the potential of the first ground conductor pattern 21 is stabilized. Therefore, cross talk between the first transmission line and the second transmission line is also significantly reduced or prevented, the cross talk being caused due to fluctuations in potential of the first ground conductor pattern 21.

In addition, the first bypassing pattern portion 41 and the second bypassing pattern portion 42 are positioned to depart away from each other perpendicularly or substantially perpendicularly to an extending direction of the first signal conductor pattern 31 and the second signal conductor pattern 32. Therefore, unwanted coupling between the first bypassing pattern portion 41 and the second bypassing pattern portion 42 through a nearby external space laterally of the multilayer insulating body 10 is significantly reduced or prevented.

Figure 3:
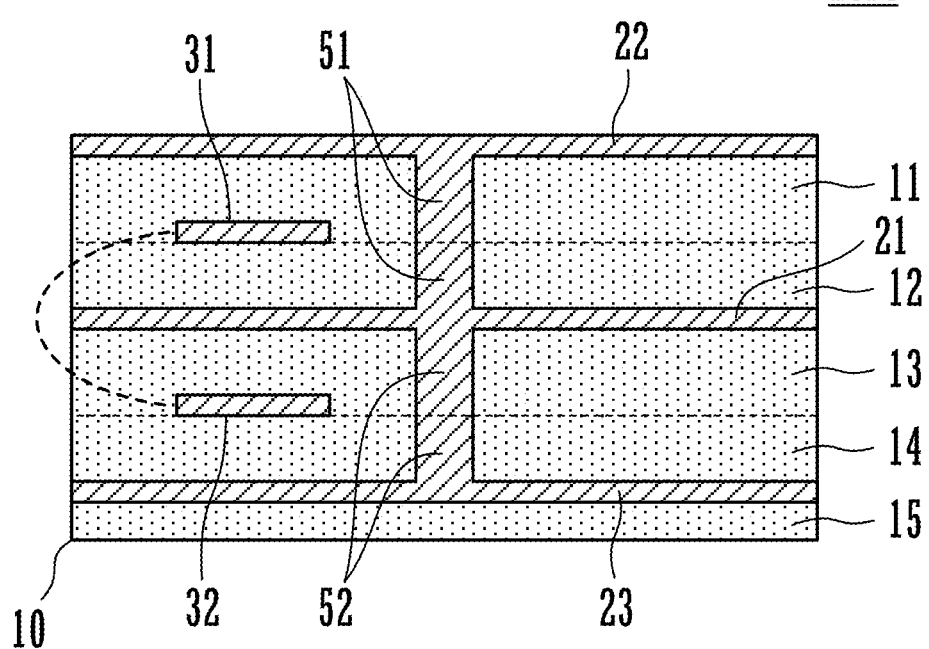
FIG. 3 is a sectional view of a transmission line as a comparative example with respect to the first preferred embodiment of the present invention.

FIG. 3 is a sectional view of a transmission line 101C as a comparative example. In the transmission line 101C, the first bypassing pattern portion 41 and the second bypassing pattern portion 42, both illustrated in FIG. 1, are deviated in the same direction. Thus, in the transmission line 101C, the first signal conductor pattern 31 and the second signal conductor pattern 32 are positioned close to each other through the nearby external space laterally of the multilayer insulating body 10. Accordingly, electric-field coupling generates as represented by a dotted line in FIG. 3 in a conceptual manner, and the unwanted coupling between the first signal conductor pattern 31 and the second signal conductor pattern 32 occurs.

On the other hand, in this preferred embodiment, the unwanted coupling between the first signal conductor pattern 31 and the second signal conductor pattern 32 in the first bypassing pattern portion 41 and the second bypassing pattern portion 42 is significantly reduced or prevented as described above. As a result, the cross talk between the first transmission line and the second transmission line is reduced.

According to this preferred embodiment, two transmission lines is able to be provided in one multilayer insulating body while an increase in dimension of a long transmission line in its width direction is significantly reduced or prevented. Furthermore, cross talk between the two transmission lines is able to be significantly reduced or prevented.

Although FIG. 1 illustrates the single first interlayer connecting conductor 51 and the single second interlayer connecting conductor 52, the first interlayer connecting conductor 51 and the second interlayer connecting conductor 52 are each practically arranged plurally in the extending direction of the first signal conductor pattern 31 and the second signal conductor pattern 32 depending on the length of the transmission line 101. In a corresponding manner, the first bypassing pattern portion 41 and the second bypassing pattern portion 42 are also each disposed plurally in states bypassing the first interlayer connecting conductors 51 and the second interlayer connecting conductors 52, respectively. In such a case, it is only necessary that the bypassing directions of a pair of the first bypassing pattern portion and the second bypassing pattern portion, which are closest to each other, among the plurality of the first bypassing pattern portions 41 and the plurality of second bypassing pattern portions 42 are opposite when viewed in the lamination direction of the insulator layers 11 to 15.

Second Preferred Embodiment

Figure 4:
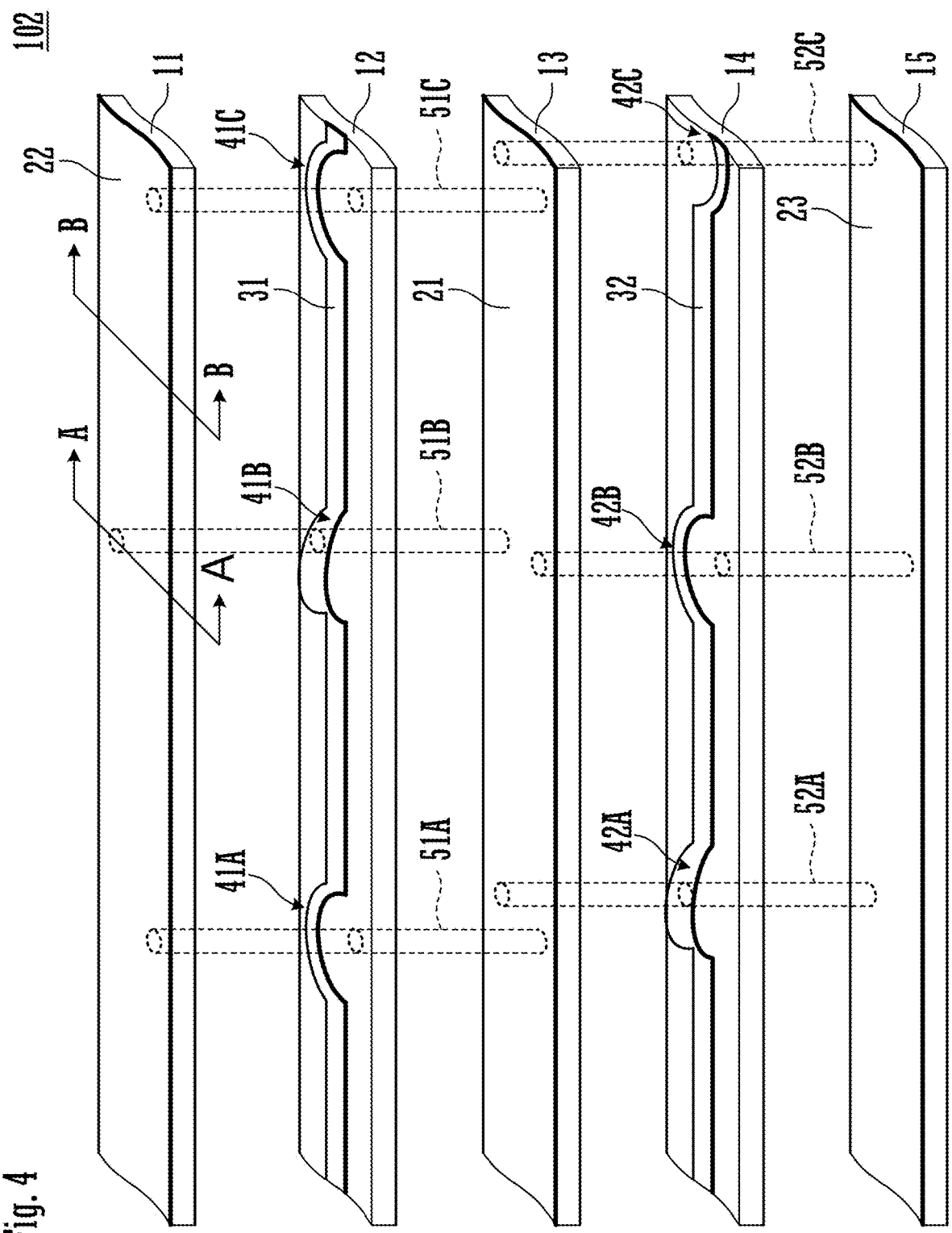
FIG. 4 is an exploded perspective view of a transmission line according to a second preferred embodiment of the present invention.
Figure 5A:
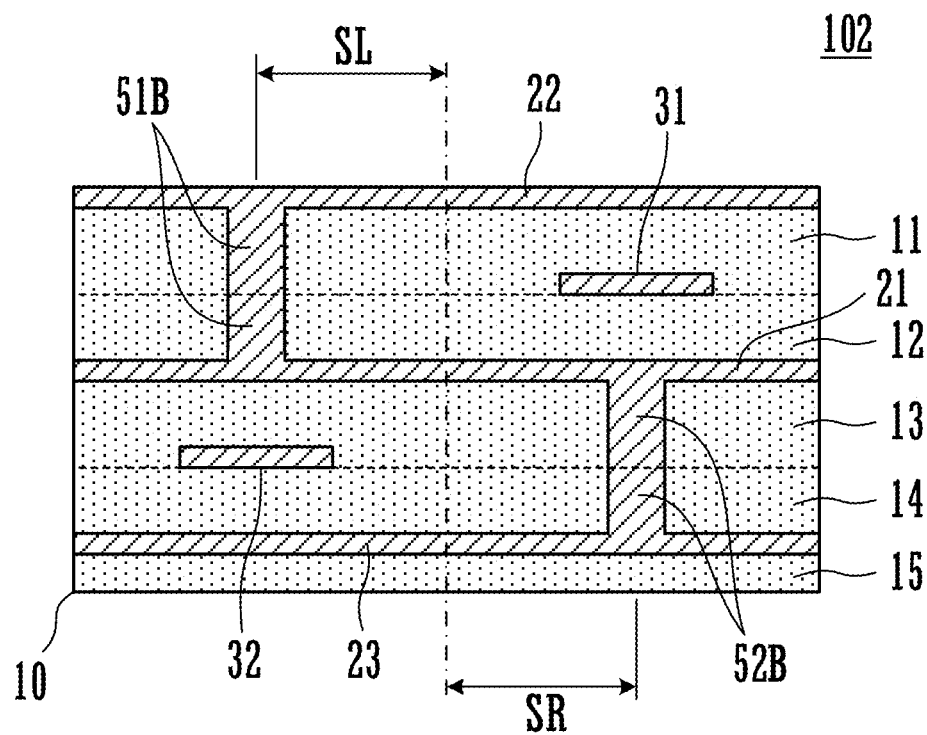
FIG. 5A is a sectional view taken along a line A-A in FIG. 4.
Figure 5B:
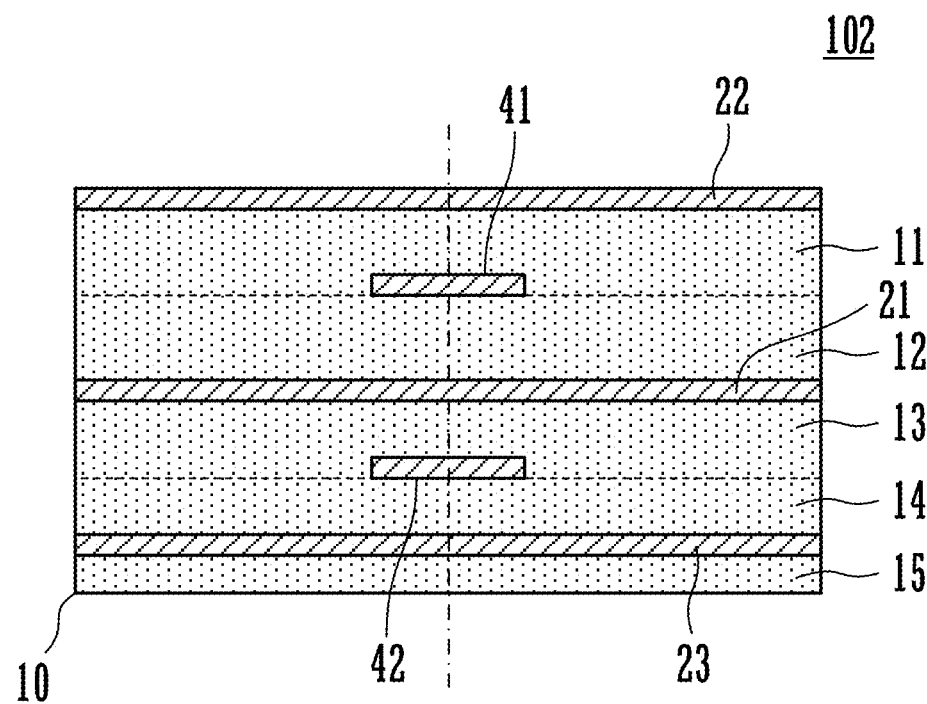
FIG. 5B is a sectional view taken along a line B-B in FIG. 4.

FIG. 4 is an exploded perspective view of a transmission line 102 according to a second preferred embodiment of the present invention. FIG. 5A is a sectional view taken along a line A-A in FIG. 4, and FIG. 5B is a sectional view taken along a line B-B in FIG. 4.

The second preferred embodiment is different from the first preferred embodiment in respective patterns of the first signal conductor pattern 31 and the second signal conductor pattern 32. Moreover, the second preferred embodiment is different from the first preferred embodiment in positions where the first interlayer connecting conductor and the second interlayer connecting conductor are located.

The transmission line 102 includes a multilayer insulating body 10 in which insulator layers 11, 12, 13, 14 and 15 are laminated. A first ground conductor pattern 21 is provided on the insulator layer 13, a second ground conductor pattern 22 is provided on the insulator layer 11, and a third ground conductor pattern 23 is provided on the insulator layer 15, respectively. A first signal conductor pattern 31 is provided on the insulator layer 12, and a second signal conductor pattern 32 is provided on the insulator layer 14, respectively. First interlayer connecting conductors 51A, 51B and 51C are provided on or in each of the insulator layers 11 and 12. Similarly, second interlayer connecting conductors 52A, 52B and 52C are provided on or in each of the insulator layers 13 and 14.

The first signal conductor pattern 31 includes first bypassing pattern portions 41A, 41B and 41C that bypass the first interlayer connecting conductor 51A, 51B and 51C, respectively, and the second signal conductor pattern 32 includes second bypassing pattern portions 42A, 42B and 42C that bypass the second interlayer connecting conductors 52A, 52B and 52C, respectively.

The first bypassing pattern portions 41A, 41B and 41C bypass the first interlayer connecting conductors, respectively, in opposite directions alternately along the extending direction of the first signal conductor pattern 31. The second bypassing pattern portions 42A, 42B and 42C bypass the second interlayer connecting conductors, respectively, in opposite directions alternately along the extending direction of the second signal conductor pattern 32.

As shown in FIG. 5A, the position where the first interlayer connecting conductor 51B is located is deviated by SL from the center of the multilayer insulating body 10 in the width direction thereof. The position where the second interlayer connecting conductor 52B is located is deviated by SR from the center of the multilayer insulating body 10 in the width direction thereof. Accordingly, a predetermined spacing is able to be secured between each of the first interlayer connecting conductors 51A, 51B and 51C and the first signal conductor pattern 31 in a plane direction. As a result, characteristic impedances of the first bypassing pattern portions 41A, 41B and 41C are each able to be held at a predetermined value. Furthermore, distances through which the first bypassing pattern portions 41A, 41B and 41C are deviated for the bypassing are able to be suppressed, and continuity of the characteristic impedance of the line is able to be ensured more easily. Hence, an increase in dimension of the multilayer insulating body 10 in its width direction is able to be significantly reduced or prevented.

In the example illustrated in FIG. 4, the first bypassing pattern portions 41A, 41B and 41C bypass the first interlayer connecting conductors in opposite directions alternately along the extending direction of the first signal conductor pattern 31, and the second bypassing pattern portions 42A, 42B and 42C bypass the second interlayer connecting conductors in opposite directions alternately along the extending direction of the second signal conductor pattern 32. However, for only one of the first signal conductor pattern 31 and the second signal conductor pattern 32, the bypassing directions of the bypassing pattern portions of the signal conductor pattern may be reversed alternately in the extending direction of the signal conductor pattern.

Third Preferred Embodiment

A third preferred embodiment of the present invention represents an example in which respective patterns of the second ground conductor pattern 22 and the third ground conductor pattern 23, etc. are different from those in the second preferred embodiment.

Figure 7A:
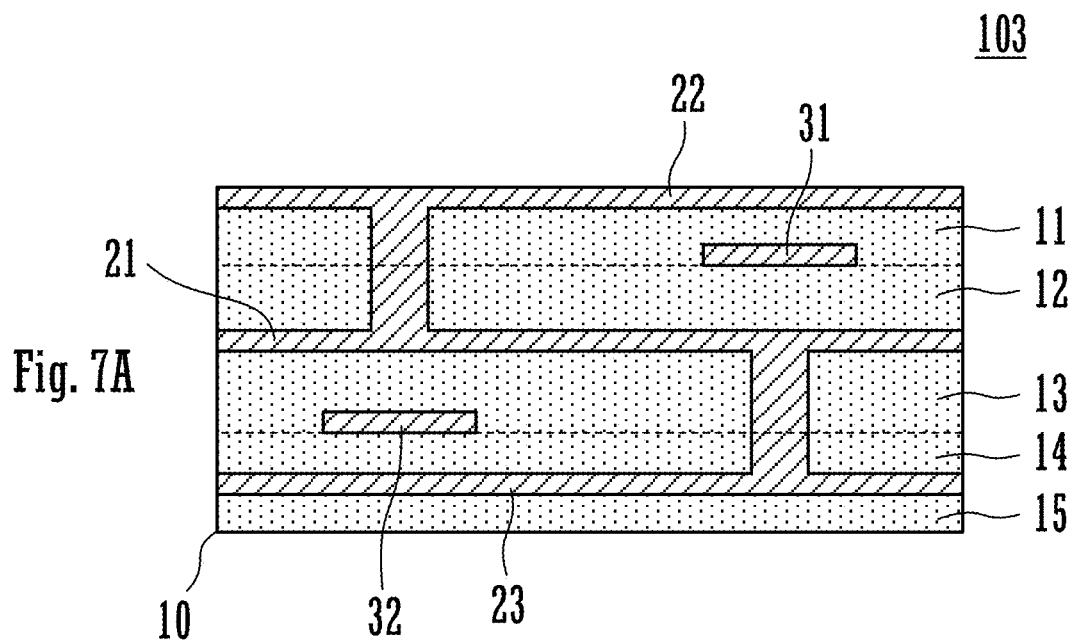
FIG. 7A is a sectional view taken along a line A-A in FIG. 6.
Figure 7B:
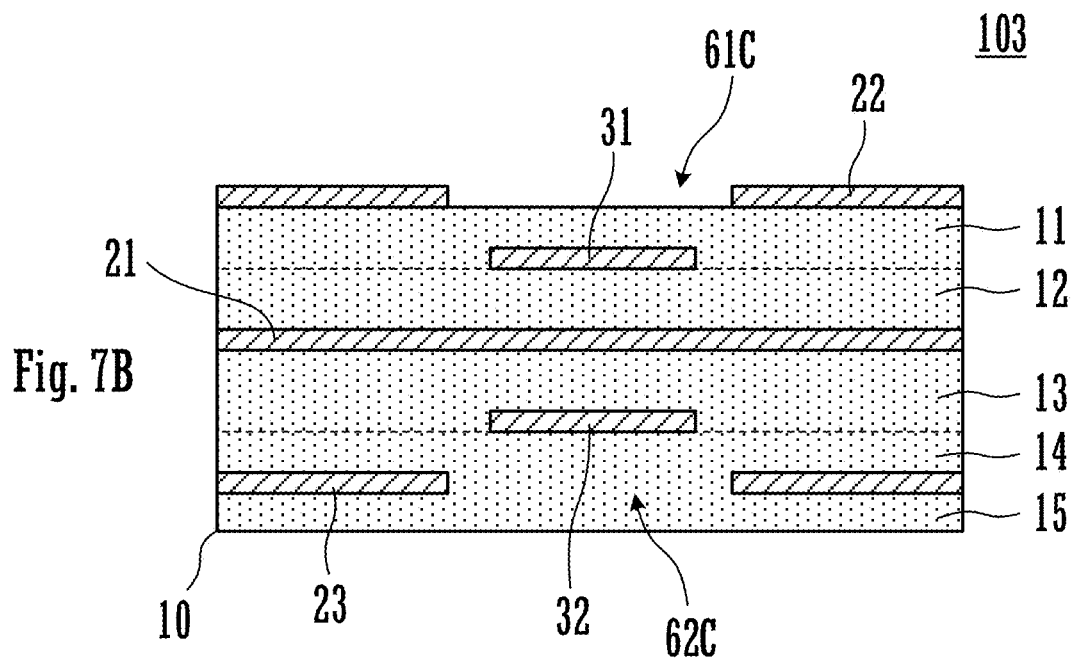
FIG. 7B is a sectional view taken along a line B-B in FIG. 6.

FIG. 6 is an exploded perspective view of a transmission line 103 according to the third preferred embodiment. FIG. 7A is a sectional view taken along a line A-A in FIG. 6, and FIG. 7B is a sectional view taken along a line B-B in FIG. 6.

The transmission line 103 includes a multilayer insulating body 10 in which insulator layers 11, 12, 13, 14 and 15 are laminated. A first ground conductor pattern 21 is provided on the insulator layer 13, a second ground conductor pattern 22 is provided on the insulator layer 11, and a third ground conductor pattern 23 is provided on the insulator layer 15, respectively. A first signal conductor pattern 31 is provided on the insulator layer 12, and a second signal conductor pattern 32 is provided on the insulator layer 14, respectively. First interlayer connecting conductors 51A, 51B and 51C are provided on or in each of the insulator layers 11 and 12. Similarly, second interlayer connecting conductors 52A, 52B and 52C are provided on or in each of the insulator layers 13 and 14.

The second ground conductor pattern 22 includes a plurality of first openings 61A, 61B and 61C that are located at positions overlapping the first signal conductor pattern 31 when viewed in the lamination direction of the insulator layers 11 to 15, and that are periodically arranged in the extending direction of the first signal conductor pattern 31.

The third ground conductor pattern 23 includes a plurality of second openings 62A, 62B and 62C that are located at positions overlapping the second signal conductor pattern 32 when viewed in the lamination direction of the insulator layers 11 to 15, and that are periodically arranged in the extending direction of the second signal conductor pattern 32.

According to the configuration described above, a capacitance generated between the first signal conductor pattern 31 and the second ground conductor pattern 22 is reduced with the presence of the first openings 61A, 61B and 61C. Thus, the interlayer size between the first signal conductor pattern 31 and the second signal conductor pattern 32 is able to be reduced, and the thickness of the multilayer insulating body is able to be reduced corresponding to the suppression of the generated capacitance. Similarly, a capacitance generated between the second signal conductor pattern 32 and the third ground conductor pattern 23 is reduced with the presence of the second openings 62A, 62B and 62C. Thus, the interlayer size between the second signal conductor pattern 32 and the third ground conductor pattern 23 is able to be reduced, and the thickness of the multilayer insulating body is able to be reduced corresponding to the suppression of the generated capacitance. In other words, even when the thickness of each of the insulator layers 11 and 14 is reduced, the characteristic impedance is prevented from being reduced excessively and thus matching with a predetermined characteristic impedance (e.g., about 50Ω) is able to be obtained more easily. As a result, the thickness of the multilayer insulating body is able to be reduced.

The first interlayer connecting conductor 51A is arranged between the first opening 61A and the first opening 61B, and the first interlayer connecting conductor 51B is arranged between the first opening 61B and the first opening 61C. In a similar way, the first interlayer connecting conductor 51C is arranged between the first opening 61C and a not-illustrated first opening adjacent to the first opening 61C.

Likewise, the second interlayer connecting conductor 52A is arranged between the second opening 62A and the second opening 62B, and the second interlayer connecting conductor 52B is arranged between the second opening 62B and the second opening 62C. In a similar way, the second interlayer connecting conductor 52C is arranged between the second opening 62C and a not-illustrated second opening adjacent to the second opening 62C.

Thus, since the first interlayer connecting conductors 51A, 51B and 51C establish interlayer connection between the first ground conductor pattern 21 and the second ground conductor pattern 22 at the positions where the first openings 61A, 61B and 61C are not provided, the first interlayer connecting conductors 51A, 51B and 51C are provided easily. Similarly, since the second interlayer connecting conductors 52A, 52B and 52C establish interlayer connection between the first ground conductor pattern 21 and the third ground conductor pattern 23 at the positions where the second openings 62A, 62B and 62C are not provided, the second interlayer connecting conductors 52A, 52B and 52C are able to be provided easily.

In this preferred embodiment, as shown in FIG. 6, each of the first signal conductor pattern 31 and the second signal conductor pattern 32 has different line widths between each of patterns, which are opposed to the first openings 61A, 61B and 61C and the second openings 62A, 62B and 62C, and a pattern not opposing thereto. More specifically, the first signal conductor pattern 31 is relatively thick in portions opposing to the first openings 61A, 61B and 61C, and is relatively thin in portions not opposing the first openings (i.e., in the bypassing pattern portions 41A, 41B and 41C). The second signal conductor pattern 32 is relatively thick in portions opposing to the second openings 62A, 62B and 62C, and is relatively thin in portions not opposing to the second openings (i.e., in the bypassing pattern portions 42A, 42B and 42C).

With such a feature, the portions of the first signal conductor pattern 31 opposing to the first openings 61A, 61B and 61C exhibit smaller change in the characteristic impedance caused due to generation of a capacitance even though those portions have a relatively large line width. Therefore, a conductor loss is able to be reduced by setting the line width of the first signal conductor pattern 31 to be relatively large. Similarly, the portions of the second signal conductor pattern 32 opposing to the second openings 62A, 62B and 62C exhibit smaller change in the characteristic impedance caused due to generation of a capacitance even though those portions have a relatively wide line width. Therefore, a conductor loss is able to be reduced by setting the line width of the second signal conductor pattern 32 to be relatively large.

Furthermore, although the bypassing pattern portions 41A, 41B and 41C are opposed to the second ground conductor pattern 22, change in the characteristic impedance caused due to generation of a capacitance between each of the bypassing pattern portions 41A, 41B and 41C and the second ground conductor pattern 22 is maintained small by setting the line width of each of the bypassing pattern portions 41A, 41B and 41C to be relatively small. Similarly, although the bypassing pattern portions 42A, 42B and 42C are opposed to the third ground conductor pattern 23, change in the characteristic impedance caused due to generation of a capacitance between each of the bypassing pattern portions 42A, 42B and 42C and the third ground conductor pattern 23 is held small by setting the line width of each of the bypassing pattern portions 41A, 41B and 41C to be relatively small. As a result, an entire width of the transmission line 103 is able to be reduced by setting the line width of each of the bypassing pattern portions 41A, 41B, 41C, 42A, 42B and 42C to be relatively small.

Fourth Preferred Embodiment

A fourth preferred embodiment of the present invention represents an example in which respective patterns of the second ground conductor pattern 22 and the third ground conductor pattern 23, etc. are different from those in the third preferred embodiment.

Figure 8:
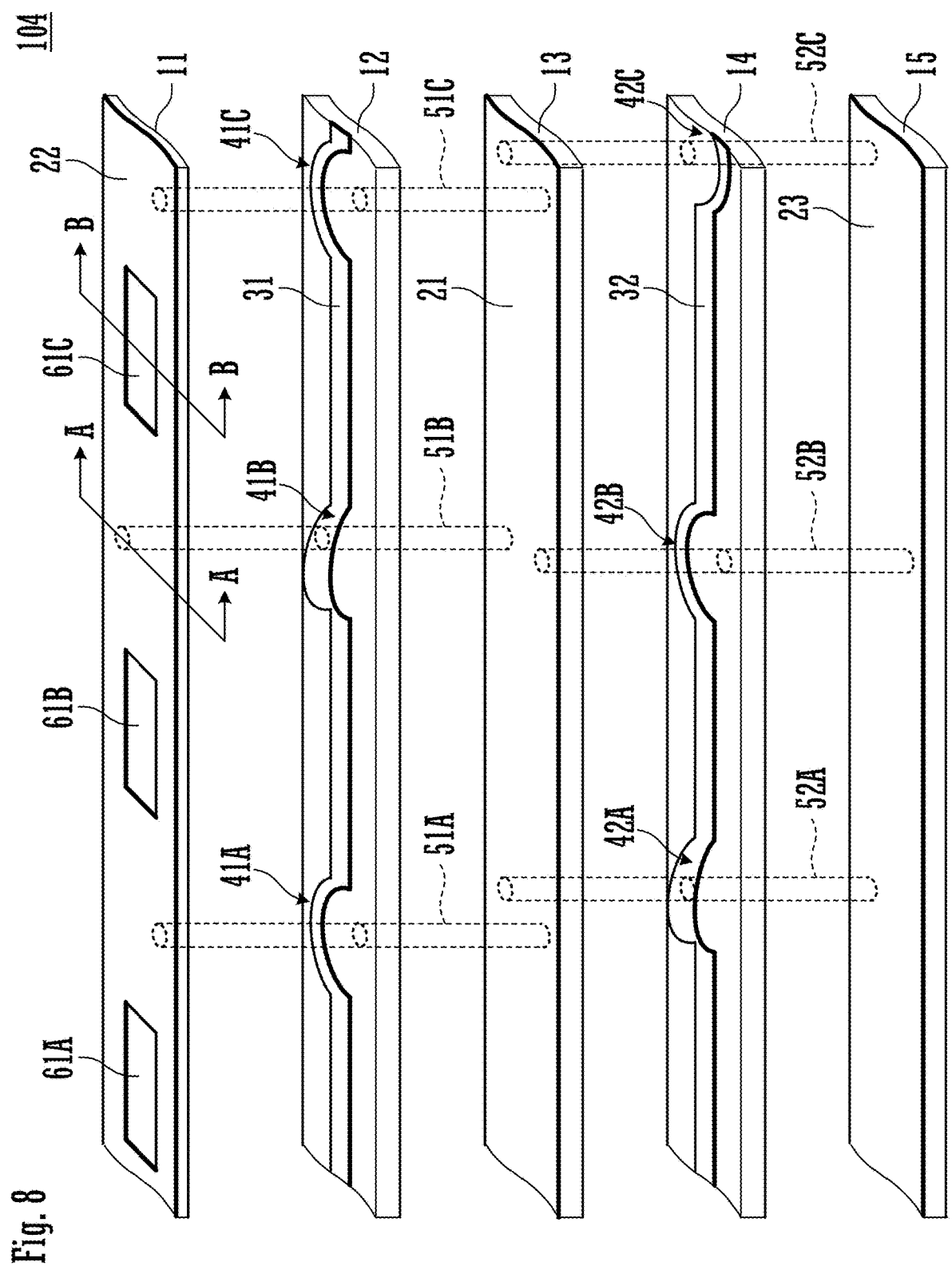
FIG. 8 is an exploded perspective view of a transmission line according to a fourth preferred embodiment of the present invention.

FIG. 8 is an exploded perspective view of a transmission line 104 according to the fourth preferred embodiment. In the transmission line 104, the second openings are not provided in the third ground conductor pattern 23 unlike the transmission line 103 illustrated in FIG. 6.

Thus, one of the two transmission lines may have a structure in which no openings are provided in the ground conductor pattern. As another modification, the openings provided in the ground conductor patterns of the two transmission lines may have different sizes.

According to this preferred embodiment, it is possible to significantly reduce or prevent unwanted radiation toward the side where no openings are provided, or the side where the ground conductor having smaller openings are provided (i.e., the side including the third ground conductor pattern 23 in the example illustrated in FIG. 8). Furthermore, even when the transmission line is arranged in a state that the side where no openings are provided or the side where the ground conductor having smaller openings are provided is disposed at (or bonded to) a position close to a metal member, the transmission line is less affected by the metal member.

While FIGS. 4, 6 and 8 illustrate an example in which portions of the first signal conductor pattern 31 other than the bypassing pattern portions 41A, 41B and 41C pass along the center of the transmission line, the first signal conductor pattern 31 may be modified such that the portions other than the bypassing pattern portions do not pass along the center of the transmission line. The first signal conductor pattern 31 may be, for example, a pattern obliquely passing the transmission line in a way of gradually approaching, from the first bypassing pattern portion 41A, toward the first bypassing pattern portion 41B, which is adjacent to the first bypassing pattern portion 41A, in the width direction of the transmission line. Similarly, the second signal conductor pattern 32 may be, for example, a pattern obliquely passing the transmission line in a way of gradually approaching, from the second bypassing pattern portion 42A, toward the second bypassing pattern portion 42B, which is adjacent to the second bypassing pattern portion 42A, in the width direction of the transmission line.

Moreover, in the signal conductor pattern, the boundary between the bypassing pattern portion and the other portion (non-bypassing pattern portion) may have a gently changing shape.

With the structures described above, abrupt changes in the characteristic impedance of the transmission line are significantly reduced or prevented, and continuity of the characteristic impedance is able to be ensured more easily. In other words, a low reflection characteristic is obtained.

Furthermore, since local concentration of an electric field does not occur in the signal conductor pattern, a signal transmission loss is reduced.

While FIGS. 4, 6 and 8 represent an example in which each of the first openings 61A, 61B and 61C, the second openings 62A, 62B and 62C, and so on preferably has a rectangular or substantially rectangular shape, the opening shape is not limited to the rectangular or substantially rectangular shape. From the viewpoint of keeping symmetry of the transmission line, however, the opening shape is preferably symmetric with respect to each of the extending direction and the width direction of the signal conductor patterns 31 and 32. Moreover, the opening shape is preferably closer to a circular or substantially circular shape, such as, e.g., an octagonal shape rather than the rectangular or substantially rectangular shape. In addition, the opening shape is preferably set such that an opening width changes in a tapering manner along the extending direction of the signal conductor pattern.

With the structures described above, abrupt changes in the characteristic impedance of the transmission line are significantly reduced or prevented, and continuity of the characteristic impedance is able to be ensured more easily. In other words, a low reflection characteristic is obtained. Furthermore, since local concentration of an electric field does not occur in the signal conductor pattern, a signal transmission loss is reduced.

Fifth Preferred Embodiment

A fifth preferred embodiment of the present invention represents an example in which the positions where respective patterns of the second ground conductor pattern 22 and the third ground conductor pattern 23, etc. are different from those in the third preferred embodiment.

Figure 9:
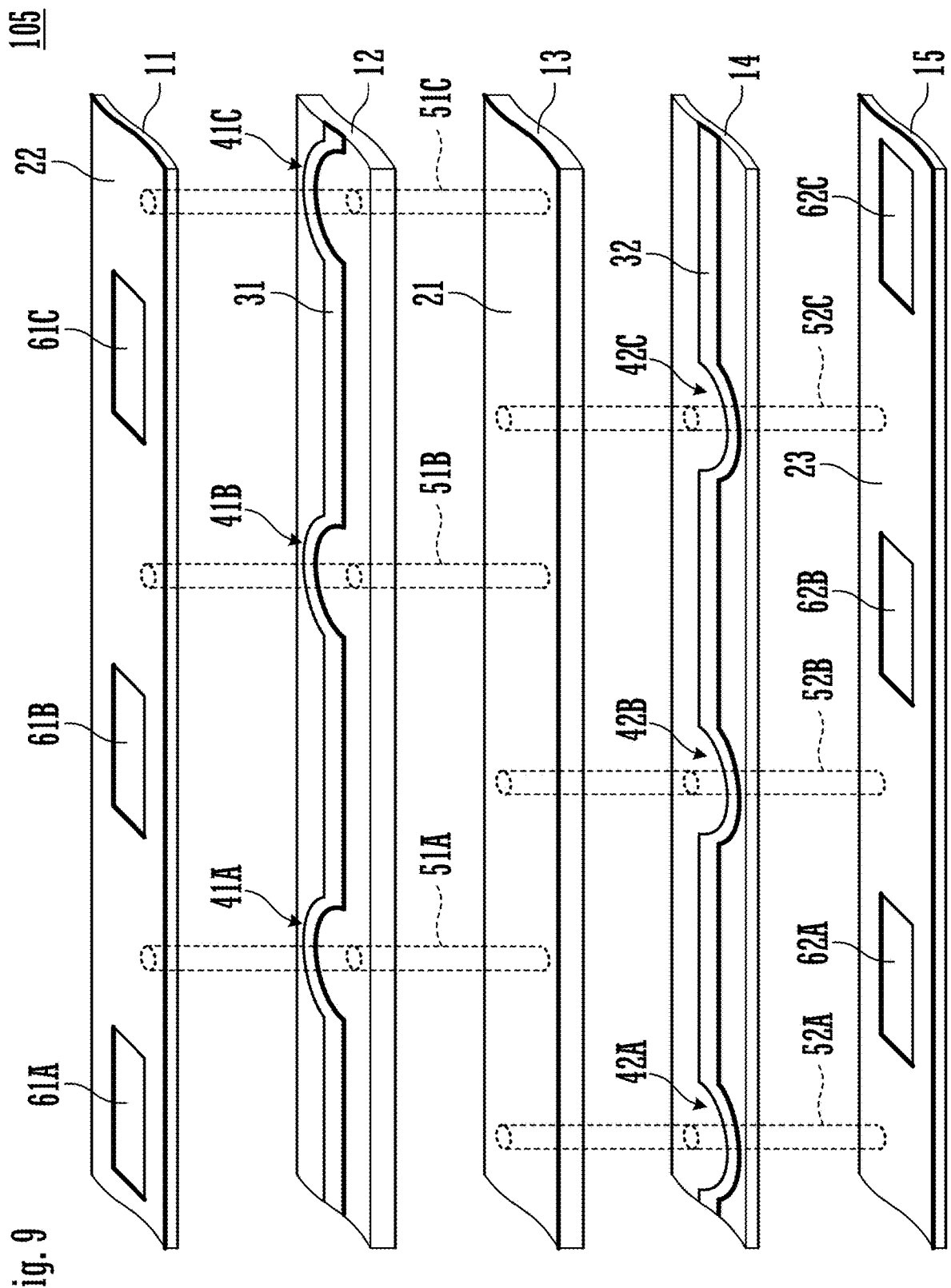
FIG. 9 is an exploded perspective view of a transmission line according to a fifth preferred embodiment of the present invention.

FIG. 9 is an exploded perspective view of a transmission line 105 according to the fifth preferred embodiment. As in the transmission line 103 illustrated in FIG. 6, the second ground conductor pattern 22 includes the first openings 61A, 61B and 61C that are periodically arranged in the extending direction of the first signal conductor pattern 31, and the third ground conductor pattern 23 includes the second openings 62A, 62B and 62C that are periodically arranged in the extending direction of the second signal conductor pattern 32. However, unlike the transmission line 103 illustrated in FIG. 6, the positions of the first openings 61A, 61B and 61C and the positions of the second openings 62A, 62B and 62C are different (shifted) from each other by a half-period. Correspondingly, the positions of the first interlayer connecting conductors 51A, 51B and 51C and the first bypassing pattern portions 41A, 41B and 41C are different from the positions of the second interlayer connecting conductors 52A, 52B and 52C and the second bypassing pattern portions 42A, 42B and 42C by a half-period. The other configuration is similar to that of the transmission line 103 described in the third preferred embodiment.

According to the fifth preferred embodiment, since the first openings 61A, 61B and 61C and the second openings 62A, 62B and 62C are spaced apart from each other in the extending direction of the first signal conductor pattern 31 and the second signal conductor pattern 32, unwanted coupling between the first signal conductor pattern 31 and the second signal conductor pattern 32 through the first openings 61A, 61B and 61C and the second openings 62A, 62B and 62C is significantly reduced or prevented.

Furthermore, since the first bypassing pattern portions 41A, 41B and 41C and the second bypassing pattern portions 42A, 42B and 42C depart away from each other, unwanted coupling between the first signal conductor pattern 31 and the second signal conductor pattern 32 through the first bypassing pattern portions 41A, 41B and 41C and the second bypassing pattern portions 42A, 42B and 42C is also significantly reduced or prevented.

Sixth Preferred Embodiment

A sixth preferred embodiment of the present invention represents a transmission line including three signal conductor patterns.

Figure 10:
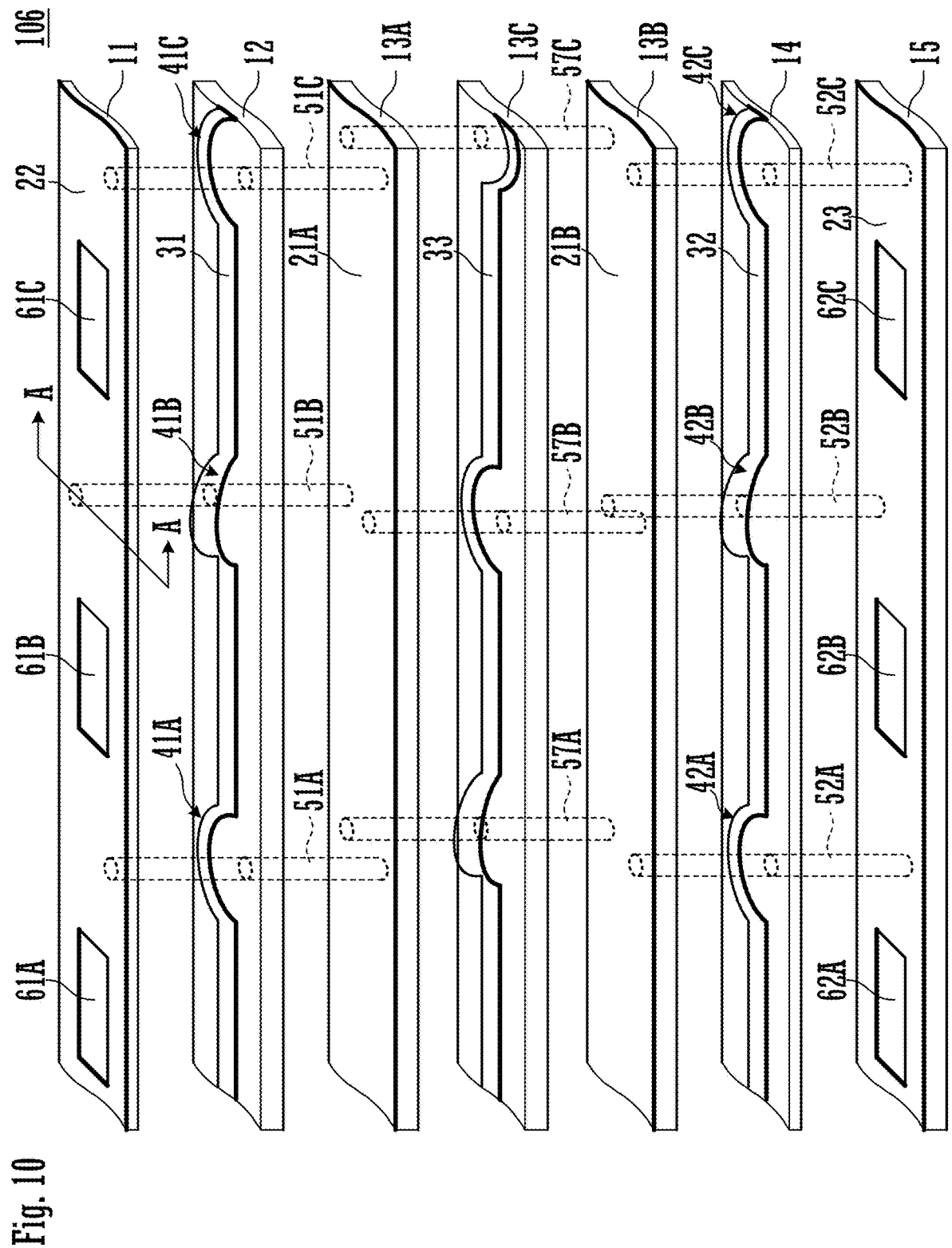
FIG. 10 is an exploded perspective view of a transmission line according to a sixth preferred embodiment of the present invention.
Figure 11:
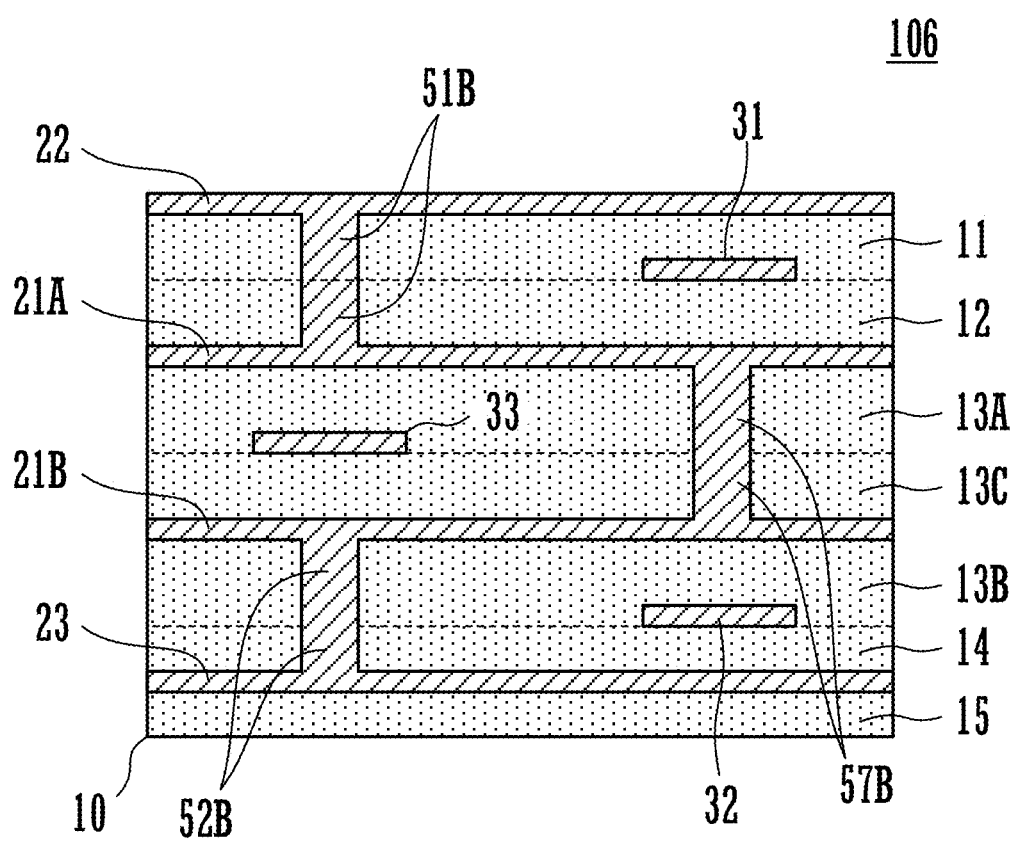
FIG. 11 is a sectional view of the transmission line, the view being taken along a line A-A in FIG. 10.

FIG. 10 is an exploded perspective view of a transmission line 106 according to the sixth preferred embodiment. FIG. 11 is a sectional view taken along a line A-A in FIG. 10.

The transmission line 106 according to this preferred embodiment includes three transmission lines. A multilayer insulating body 10 includes insulator layers 11, 12, 13A, 13C, 13B, 14 and 15. First ground conductor patterns 21A and 21B are provided on the insulator layers 13A and 13B, respectively. A third signal conductor pattern 33 is provided on the insulator layer 13C. The first ground conductor patterns 21A and 21B are each a conductor pattern having a larger width than the third signal conductor pattern 33.

A second ground conductor pattern 22 is provided on the insulator layer 11, and a third ground conductor pattern 23 is provided on the insulator layer 15. A first signal conductor pattern 31 is provided on the insulator layer 12, and a second signal conductor pattern 32 is provided on the insulator layer 14.

A first transmission line is defined by the first ground conductor pattern 21A, the second ground conductor pattern 22, and the first signal conductor pattern 31. A second transmission line is defined by the first ground conductor pattern 21B, the third ground conductor pattern 23, and the second signal conductor pattern 32. In addition, a third transmission line is defined by the first ground conductor patterns 21A and 21B, and the third signal conductor pattern 33.

Thus, the third transmission line is defined preferably by forming the first ground conductor pattern as the two first ground conductor patterns 21A and 21B that are provided on two layers, respectively, and by arranging the third signal conductor pattern 33 between the two first ground conductor patterns 21A and 21B. The first ground conductor pattern 21A and the second ground conductor pattern 22 are connected to each other through the first interlayer connecting conductors 51A, 51B and 51C, etc. The first ground conductor pattern 21B and the third ground conductor pattern 23 are connected to each other through the second interlayer connecting conductors 52A, 52B and 52C, etc. The first ground conductor pattern 21A and the first ground conductor pattern 21B are connected to each other through third interlayer connecting conductors 57A, 57B and 57C, etc.

Similarly, the third transmission line is constituted plurally preferably by forming the first ground conductor pattern as three or more first ground conductor patterns that are provided on three or more layers, respectively, and by arranging the third signal conductor pattern between every adjacent two of the three or more first ground conductor patterns. In other words, a multicore transmission line including four or more cores is provided.

Seventh Preferred Embodiment

A seventh preferred embodiment of the present invention represents an example in which the layout of the interlayer connecting conductors is different from that in the above-described preferred embodiments.

Figure 12:
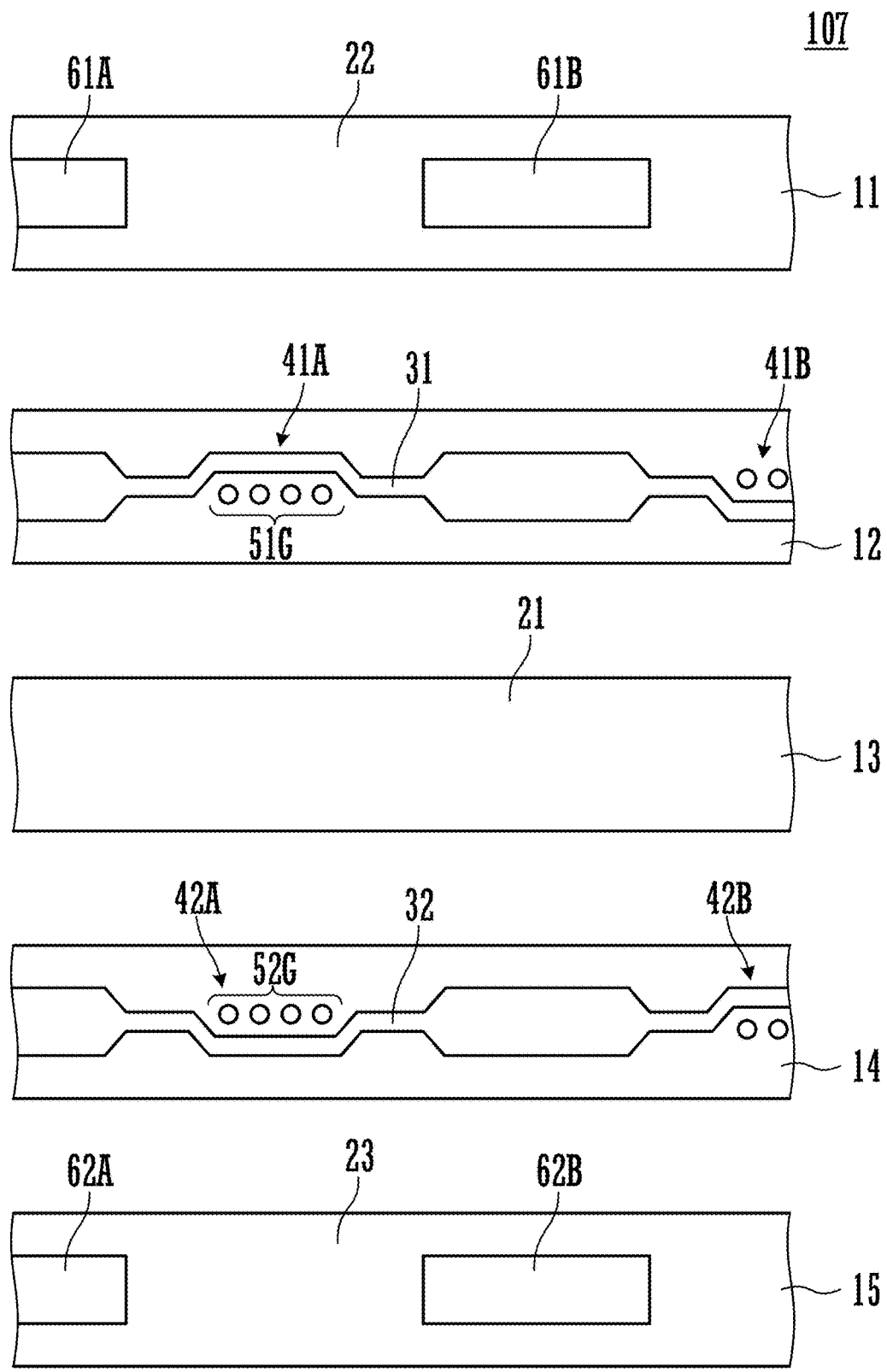
FIG. 12 is an exploded plan view of a transmission line according to a seventh preferred embodiment of the present invention.

FIG. 12 is an exploded plan view of a transmission line 107 according to a seventh preferred embodiment of the present invention. The transmission line 107 is different in shapes of the first and second signal conductor patterns and layouts of the first and second interlayer connecting conductors in comparison with the transmission line 103 described in the third preferred embodiment.

The transmission line 107 includes a multilayer insulating body in which insulator layers 11, 12, 13, 14 and 15 are laminated. A first ground conductor pattern 21 is provided on the insulator layer 13, a second ground conductor pattern 22 is provided on the insulator layer 11, and a third ground conductor pattern 23 is provided on the insulator layer 15, respectively. A first signal conductor pattern 31 is provided on the insulator layer 12, and a second signal conductor pattern 32 is provided on the insulator layer 14, respectively. A first interlayer connecting conductor group 51G is provided on or in each of the insulator layers 11 and 12. Similarly, a second interlayer connecting conductor group 52G is provided on or in each of the insulator layers 13 and 14.

The first interlayer connecting conductor group 51G is defined by four interlayer connecting conductors that are arrayed in the extending direction of the first signal conductor pattern 31. Similarly, the second interlayer connecting conductor group 52G is defined by four interlayer connecting conductors that are arrayed in the extending direction of the second signal conductor pattern 32.

The first signal conductor pattern 31 includes a first bypassing pattern portion 41A that bypasses the first interlayer connecting conductor group 51G together (in a lump), and the second signal conductor pattern 32 includes a second bypassing pattern portion 42A that bypasses the second interlayer connecting conductor group 52G together (in a lump).

With the configuration described above, since the first ground conductor pattern 21 is electrically conducted to the second ground conductor pattern 22 through the first interlayer connecting conductor group 51G, the first ground conductor pattern 21 and the second ground conductor pattern 22 are held at an electrically more stable potential. Moreover, since the first interlayer connecting conductor group 51G is arranged laterally of the first signal conductor pattern 31, the first signal conductor pattern 31 is further shielded in a lateral direction with respect to the transmission direction. Similarly, since the first ground conductor pattern 21 is electrically conducted to the third ground conductor pattern 23 through the second interlayer connecting conductor group 52G, the first ground conductor pattern 21 and the third ground conductor pattern 23 are held at an electrically more stable potential. Moreover, since the second interlayer connecting conductor group 52G is arranged laterally of the second signal conductor pattern 32, the second signal conductor pattern 32 is further shielded in the lateral direction with respect to the transmission direction.

The first and second interlayer connecting conductor groups are each not limited to a group including four interlayer connecting conductors. Similar advantageous effects to those described above are able to be obtained insofar as the interlayer connecting conductor group includes a plurality of interlayer connecting conductors.

Eighth Preferred Embodiment

An eighth preferred embodiment of the present invention represents a transmission line that is featured in a positional relation between interlayer connecting conductors close to each other, and in a positional relation between bypassing pattern portions close to each other.

Figure 13A:
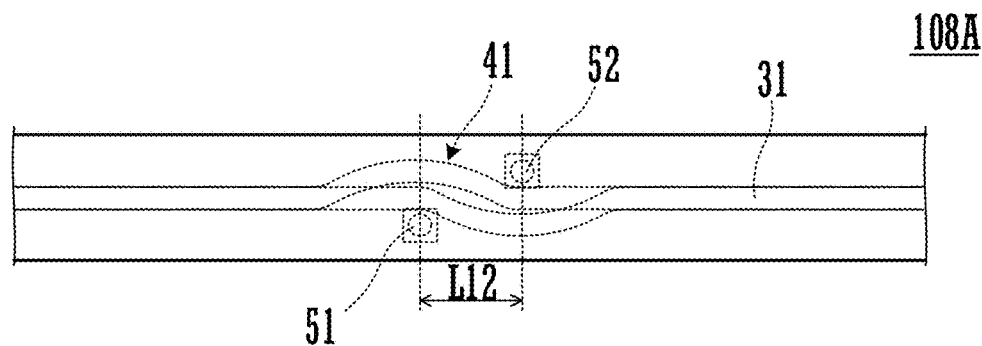
FIGS. 13A and 13B illustrate positional relations among signal conductor patterns, bypassing pattern portions, interlayer connecting conductors, and so on, which are provided in a transmission line according to an eighth preferred embodiment of the present invention.
Figure 13B:
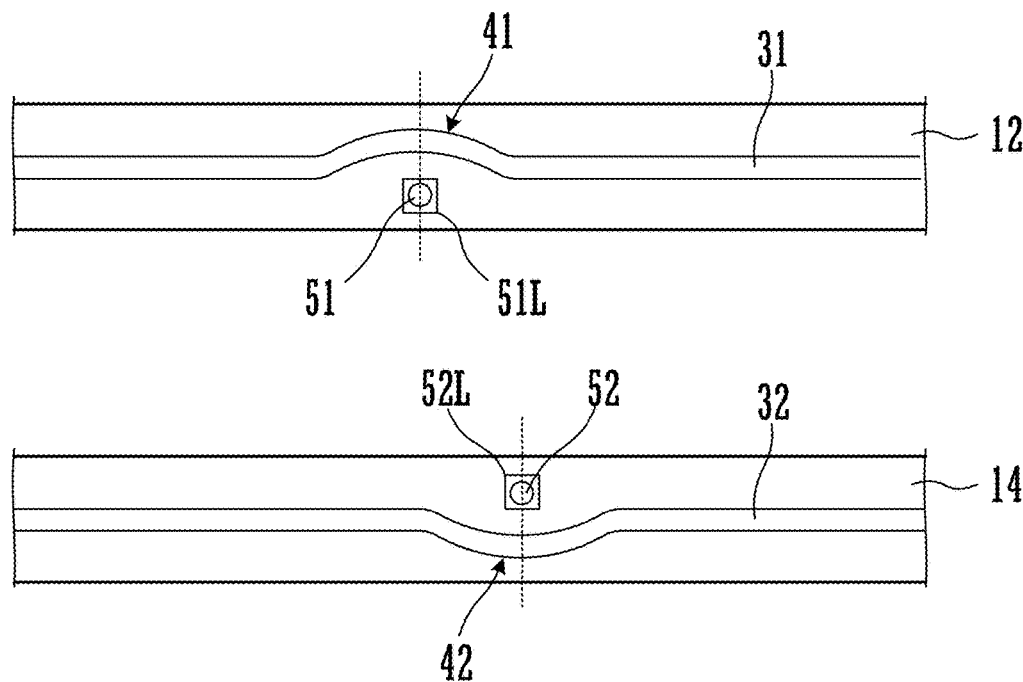
Figure 14A:
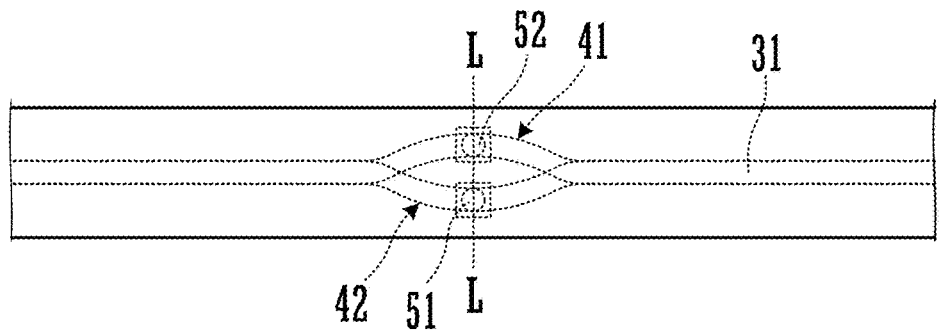
FIGS. 14A and 14B illustrate a transmission line as a comparative example with respect to the eighth preferred embodiment of the present invention.
Figure 14B:
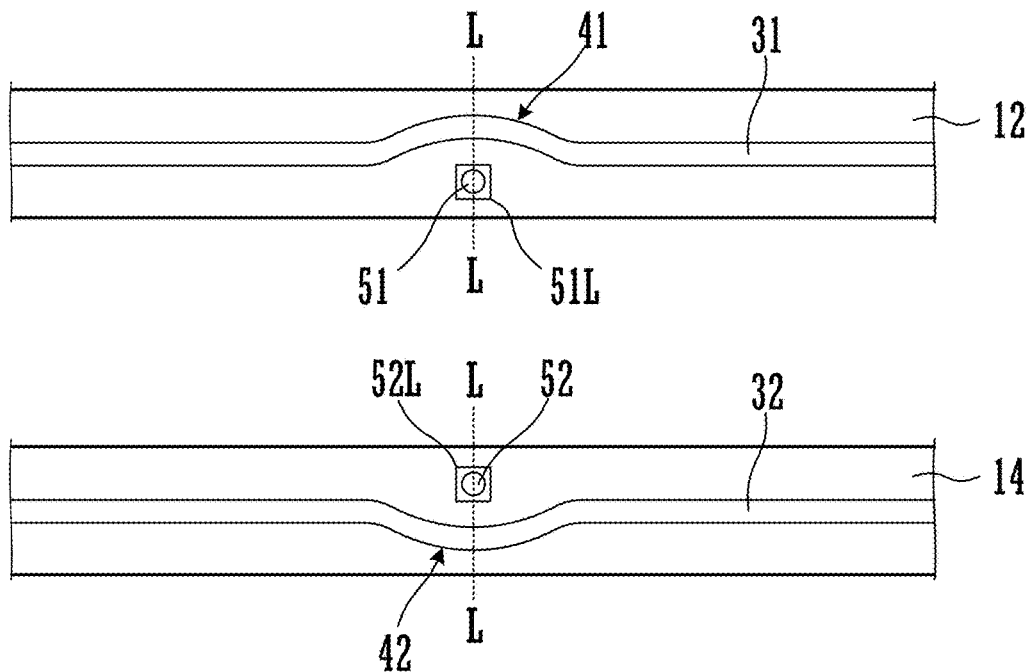

FIGS. 13A and 13B illustrate positional relations among first and second signal conductor patterns 31 and 32, first and second bypassing pattern portions 41 and 42, first and second interlayer connecting conductors 51 and 52, and so on, which are provided in a transmission line 108A according to the eighth preferred embodiment. FIGS. 14A and 14B illustrate a transmission line as a comparative example with respect to the eighth preferred embodiment.

FIG. 13A is a plan view of the transmission line 108A. FIG. 13B is a plan view of each of two insulator layers in the transmission line 108A. A basic structure of the transmission line 108A is similar to that of the transmission line 101 illustrated in FIG. 1 and described in the first preferred embodiment.

As shown in FIG. 13B, the first signal conductor pattern 31, the first interlayer connecting conductor 51, and an interlayer connection land pattern 51L are provided on and in the insulator layer 12. The first signal conductor pattern 31 includes a first bypassing pattern portion 41. The second signal conductor pattern 32, the second interlayer connecting conductor 52, and an interlayer connection land pattern 52L are provided on and in the insulator layer 14. The second signal conductor pattern 32 includes a second bypassing pattern portion 42.

On the other hand, FIG. 14A is a plan view of a transmission line as a comparative example. FIG. 14B is a plan view of each of two insulator layers in the comparative transmission line. In the comparative transmission line illustrated in FIGS. 14A and 14B, the first interlayer connecting conductor 51 and the second interlayer connecting conductor 52 are not overlapped with each other as illustrated, but they are arranged at the same position in the extending direction of the first signal conductor pattern 31 (i.e., at a position in alignment with one dotted line L-L in FIGS. 14A and 14B).

In the transmission line 108A according to this preferred embodiment, as shown in FIG. 13A, the first interlayer connecting conductor 51 and the second interlayer connecting conductor 52 are deviated from each other by a distance L12 in the extending direction of the first signal conductor pattern 31.

With the configuration described above, in the transmission line 108A according to this preferred embodiment, concentration of the interlayer connecting conductors is moderated in comparison with the configuration of the comparative transmission line illustrated in FIG. 14. In other words, the interlayer connecting conductors are arranged in a distributed way in the plane direction. As a result, the thickness of the multilayer insulating body in the lamination direction is able to be maintained uniform more easily.

Figure 15A:
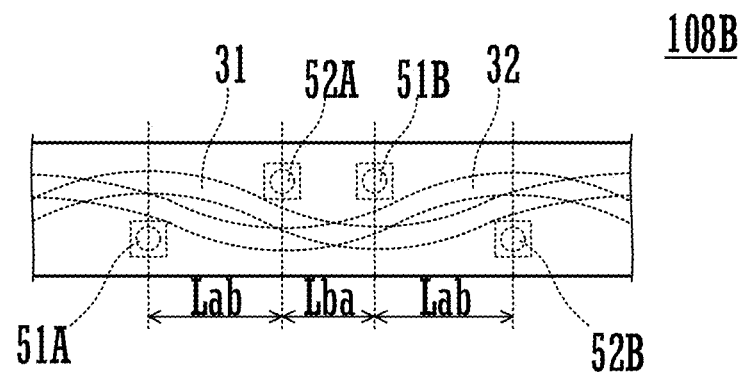
FIG. 15A is a plan view of another transmission line according to the eighth preferred embodiment of the present invention.
Figure 15B:
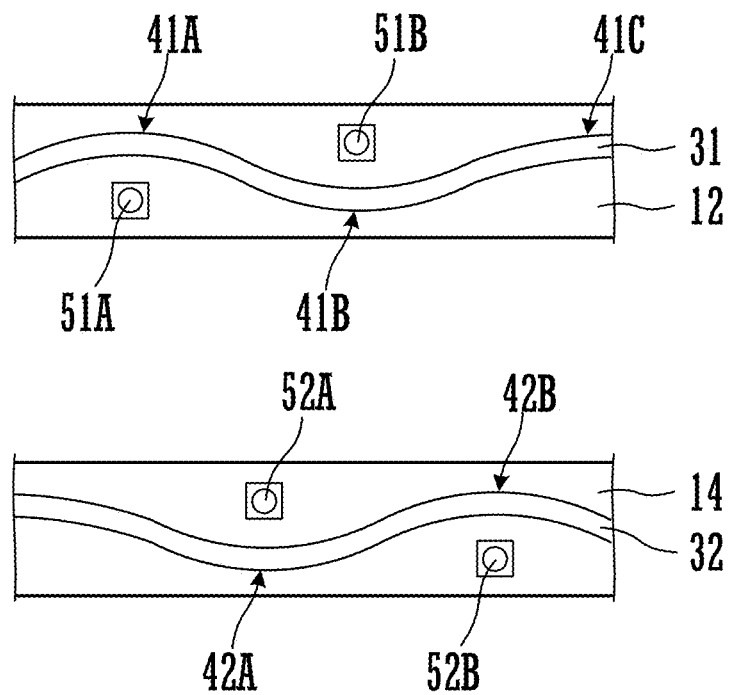
FIG. 15B is a plan view of two insulator layers in the other transmission line according to the eighth preferred embodiment of the present invention.

FIG. 15A is a plan view of another transmission line 108B according to this preferred embodiment. FIG. 15B is a plan view of each of two insulator layers in the transmission line 108B. A basic structure of the transmission line 108B is similar to that of the transmission line 102 illustrated in FIG. 4 and described in the second preferred embodiment.

As shown in FIG. 15B, a first signal conductor pattern 31 including first bypassing pattern portions 41A, 41B, 41C, etc., which are continuously provided, and interlayer connecting conductors 51A and 51B are provided on and in the insulator layer 12. A second signal conductor pattern 32 including second bypassing pattern portions 42A, 42B, etc., which are continuously provided, and interlayer connecting conductors 52A and 52B are provided on and in the insulator layer 14.

As shown in FIG. 15A, the first interlayer connecting conductor 51A and the second interlayer connecting conductor 52A are deviated from each other by a distance Lab in the extending direction of the first signal conductor pattern 31. Similarly, the first interlayer connecting conductor 51B and the second interlayer connecting conductor 52B are deviated from each other by the distance Lab in the extending direction of the first signal conductor pattern 31. Moreover, the second interlayer connecting conductor 52A and the first interlayer connecting conductor 51B are deviated from each other by a distance Lba in the extending direction of the first signal conductor pattern 31.

Thus, in the case where the plurality of interlayer connecting conductors are arrayed in the extending direction of the signal conductor pattern, concentration of the interlayer connecting conductors is moderated by arranging the interlayer connecting conductors to be spaced apart from each other in the extending direction of the first signal conductor pattern 31 such that the first interlayer connecting conductor and the second interlayer connecting conductor are neither overlapped, nor positioned very close to each other. In other words, the interlayer connecting conductors are arranged in a distributed way in the plane direction. As a result, the thickness of the multilayer insulating body in the lamination direction is able to be maintained uniform more easily.

Ninth Preferred Embodiment

A ninth preferred embodiment of the present invention represents a transmission line including a plurality of insulator layers having different dielectric constants.

Figure 16:
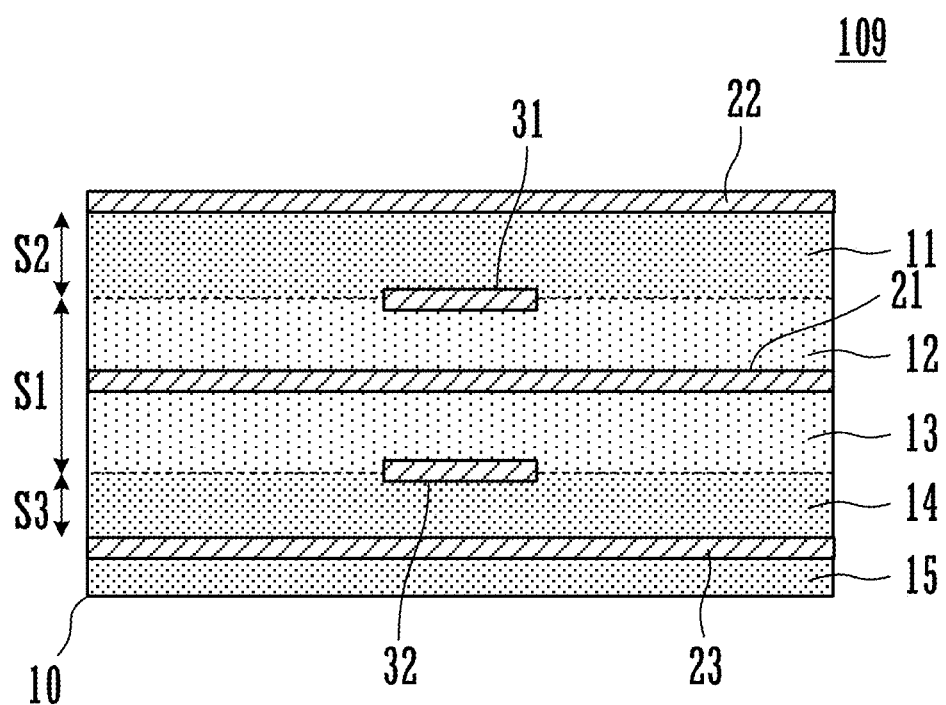
FIG. 16 is a sectional view of a transmission line according to a ninth preferred embodiment of the present invention.

FIG. 16 is a sectional view of a transmission line 109 according to the ninth preferred embodiment. In the transmission line 109, the plurality of the insulator layers include insulator layers having different dielectric constants unlike the configurations described in the first to eighth preferred embodiments.

In the transmission line 109, a first transmission line is defined by the first ground conductor pattern 21, the second ground conductor pattern 22, the first signal conductor pattern 31, and the insulator layers 11 and 12 interposed between those ground conductor patterns. A second transmission line is defined by the first ground conductor pattern 21, the third ground conductor pattern 23, the second signal conductor pattern 32, and the insulator layers 13 and 14 interposed between those ground conductor patterns.

The dielectric constant of the insulator layer 12 interposed between the first ground conductor pattern 21 and the first signal conductor pattern 31 and of the insulator layer 13 (i.e., a first region S1) interposed between the first ground conductor pattern 21 and the second signal conductor pattern 32 is lower than that of the insulator layer 11 (i.e., a second region S2) interposed between the second ground conductor pattern 22 and the first signal conductor pattern 31 and that of the insulator layer 14 (i.e., a third region S3) interposed between the third ground conductor pattern 23 and the second signal conductor pattern 32.

With the above-described features that the first ground conductor pattern 21 is arranged between the first signal conductor pattern 31 and the second signal conductor pattern 32 in an overlapped relation to those two signal conductor patterns 31 and 32 when looked at in a plan view, and that the dielectric constants of the insulator layers are set to satisfy the above-mentioned relationship, the coupling between the first signal conductor pattern 31 and the second signal conductor pattern 32 can be weakened. In other words, since a magnetic field is more apt to spread toward the ground conductor patterns located in outer side portions (i.e., in the second ground conductor pattern 22 and the third ground conductor pattern 23) than toward the ground conductor pattern located in an inner side portion (i.e., in the first ground conductor pattern 21), the coupling between the first signal conductor pattern 31 and the second signal conductor pattern 32 through a space laterally of the transmission line 109 (i.e., through air) is able to be significantly reduced or prevented. As a result, isolation between the first transmission line and the second transmission line is able to be increased.

Tenth Preferred Embodiment

A tenth preferred embodiment of the present invention represents a transmission line including insulator layers having different dielectric constants in a combined manner.

Figure 17:
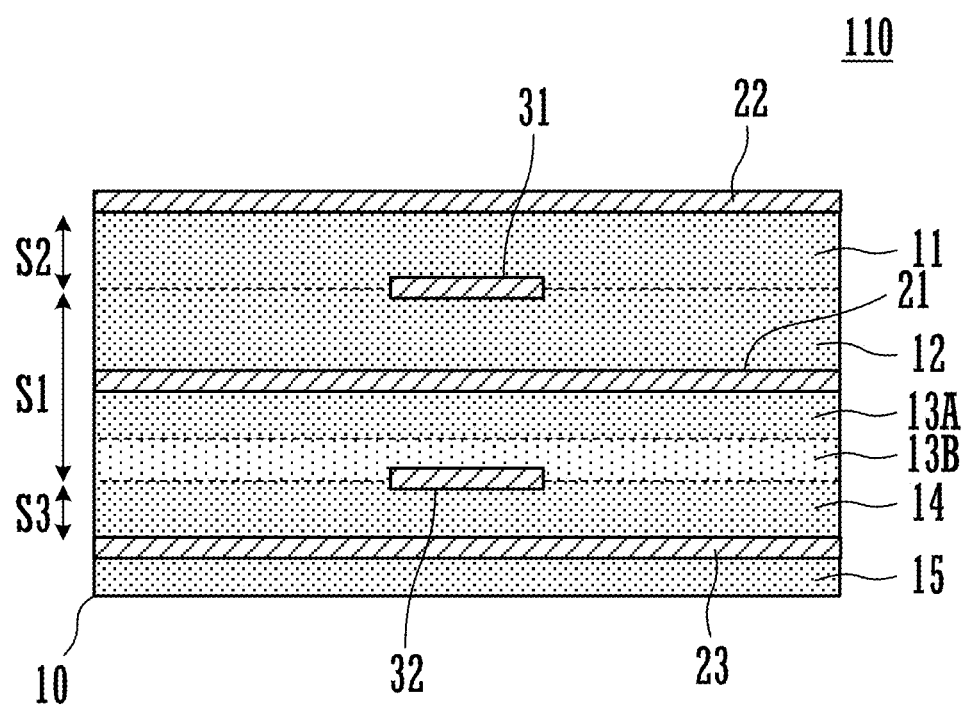
FIG. 17 is a sectional view of a transmission line according to a tenth preferred embodiment of the present invention.

FIG. 17 is a sectional view of a transmission line 110 according to the tenth preferred embodiment. In the transmission line 110, the plurality of the insulator layers include insulator layers having different dielectric constants unlike the configurations described in the first to eighth preferred embodiments. This insulator layer having a lower dielectric constant is disposed in a portion of the first region S1 described in the ninth preferred embodiment.

In the transmission line 110, a first transmission line is defined by the first ground conductor pattern 21, the second ground conductor pattern 22, the first signal conductor pattern 31, and the insulator layers 11 and 12 interposed between those ground conductor patterns. A second transmission line is defined by the first ground conductor pattern 21, the third ground conductor pattern 23, the second signal conductor pattern 32, and insulator layers 13A, 13B and 14 interposed between those ground conductor patterns.

In this preferred embodiment, the effective dielectric constants of the insulator layers 13A and 13B interposed between the first ground conductor pattern 21 and the second signal conductor pattern 32 are lower than that of the insulator layer 14 interposed between the third ground conductor pattern 23 and the second signal conductor pattern 32. Thus, the dielectric constant in the first region S1 may be reduced by arranging one or more layers having relatively low dielectric constants in a portion of the first region S1.

Furthermore, a wave length contraction effect is able to be significantly reduced or prevented by setting the dielectric constant of the insulator layer 13B, which is positioned close to (or in contact with) the signal conductor pattern (i.e., the second signal conductor pattern 32 in the example of FIG. 17), to be lower than that of the insulator layer 13A, which is positioned farther apart (or spaced) from the signal conductor pattern. As a result, the physical length of one wave length is able to be increased, and a transmission loss caused by transmission over a certain distance is able to be reduced.

With the above-described features that the first ground conductor pattern 21 is arranged between the first signal conductor pattern 31 and the second signal conductor pattern 32 in an overlapped relation to those two signal conductor patterns 31 and 32 when looked at in a plan view, and that the dielectric constants of the insulator layers are set to satisfy the above-mentioned relationship, the coupling between the first signal conductor pattern 31 and the second signal conductor pattern 32 is able to be weakened. In other words, since a magnetic field is more apt to spread toward the ground conductor pattern located in an outer side portion (i.e., in the third ground conductor pattern 23) than toward the ground conductor pattern located in an inner side portion (i.e., in the first ground conductor pattern 21), the coupling between the first signal conductor pattern 31 and the second signal conductor pattern 32 through a space laterally of the transmission line 110 (i.e., through air) is able to be significantly reduced or prevented. As a result, the isolation between the first transmission line and the second transmission line is able to be increased.

Eleventh Preferred Embodiment

An eleventh preferred embodiment of the present invention represents a transmission line including a plurality of insulator layers having different dielectric constants.

Figure 18:
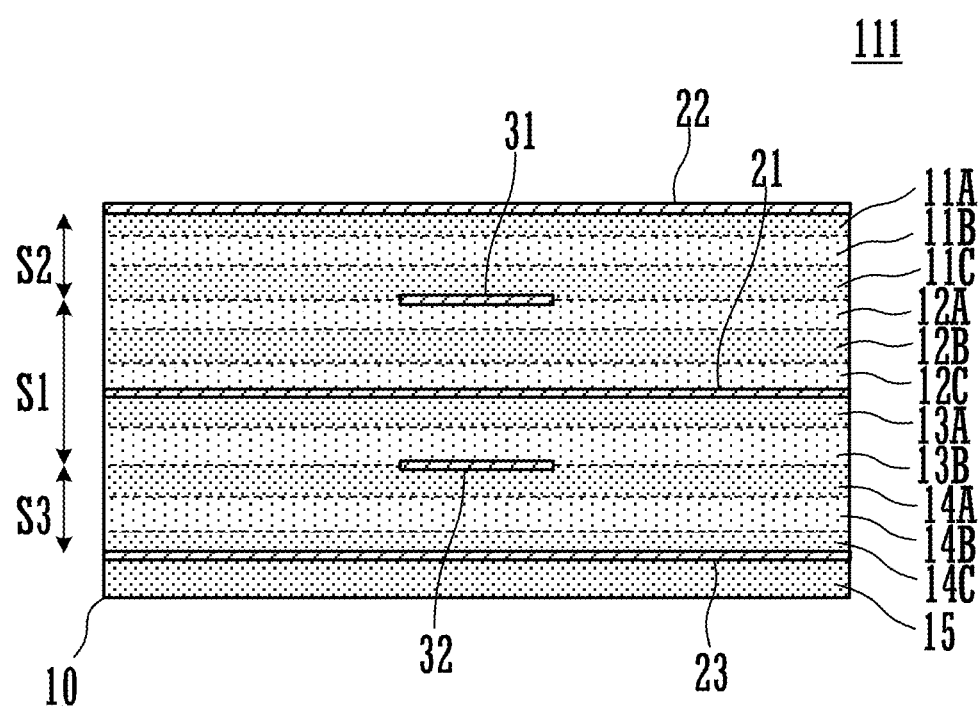
FIG. 18 is a sectional view of a transmission line according to an eleventh preferred embodiment of the present invention.

FIG. 18 is a sectional view of a transmission line 111 according to the eleventh preferred embodiment. In the transmission line 111, an insulator layer interposed between a ground conductor pattern and a signal conductor pattern is defined by arranging insulator layers having relatively low dielectric constants in a distributed way.

Insulator layers 12A, 12B and 12C are interposed between the first ground conductor pattern 21 and the first signal conductor pattern 31, and insulator layers 11A, 11B and 11C are interposed between the second ground conductor pattern 22 and the first signal conductor pattern 31. Furthermore, insulator layers 13A and 13B are interposed between the first ground conductor pattern 21 and the second signal conductor pattern 32, and insulator layers 14A, 14B and 14C are interposed between the third ground conductor pattern 23 and the second signal conductor pattern 32.

According to this preferred embodiment, since the insulator layers having relatively low dielectric constants are arranged in a distributed way, stress strain caused due to differences in physical properties between the insulator layer having a relatively low dielectric constant and the other insulator layer (having a relatively high dielectric constant) is able to be distributed. As a result, peeling-off between two types of the insulator layers having different dielectric constants is harder to occur.

Moreover, since the insulator layers having relatively low dielectric constants are disposed in each of the second region S2 and the third region S3 as well, the capacitance between the signal conductor pattern and the ground conductor pattern is able to be reduced to a predetermined value even when the distance between the first signal conductor pattern 31 and the second ground conductor pattern 22 and the distance between the second signal conductor pattern 32 and the third ground conductor pattern 23 are reduced. Hence, the transmission line is able to have a smaller thickness. In this case, the above-described effect of increasing the isolation between the transmission lines is also obtained by increasing a proportion of the one or more portions having relatively low dielectric constants in the insulator layers (12A, 12B, 12C, 13A and 13B) in the first region S1.

With the above-described features that the first ground conductor pattern 21 is arranged between the first signal conductor pattern 31 and the second signal conductor pattern 32 in an overlapped relation to those two signal conductor patterns 31 and 32 when looked at in a plan view, and that the dielectric constants of the insulator layers are set to satisfy the above-mentioned relationship, the coupling between the first signal conductor pattern 31 and the second signal conductor pattern 32 is able to be weakened. In other words, since a magnetic field is more apt to spread toward the ground conductor patterns located in outer side portions (i.e., in the second ground conductor pattern 22 and the third ground conductor pattern 23) than toward the ground conductor pattern located in an inner side portion (i.e., in the first ground conductor pattern 21), the coupling between the first signal conductor pattern 31 and the second signal conductor pattern 32 through a space laterally of the transmission line 111 (i.e., through air) is able to be significantly reduced. As a result, the isolation between the first transmission line and the second transmission line is able to be significantly increased.

Twelfth Preferred Embodiment

A twelfth preferred embodiment of the present invention represents an example of a cable including a transmission line.

Figure 19:
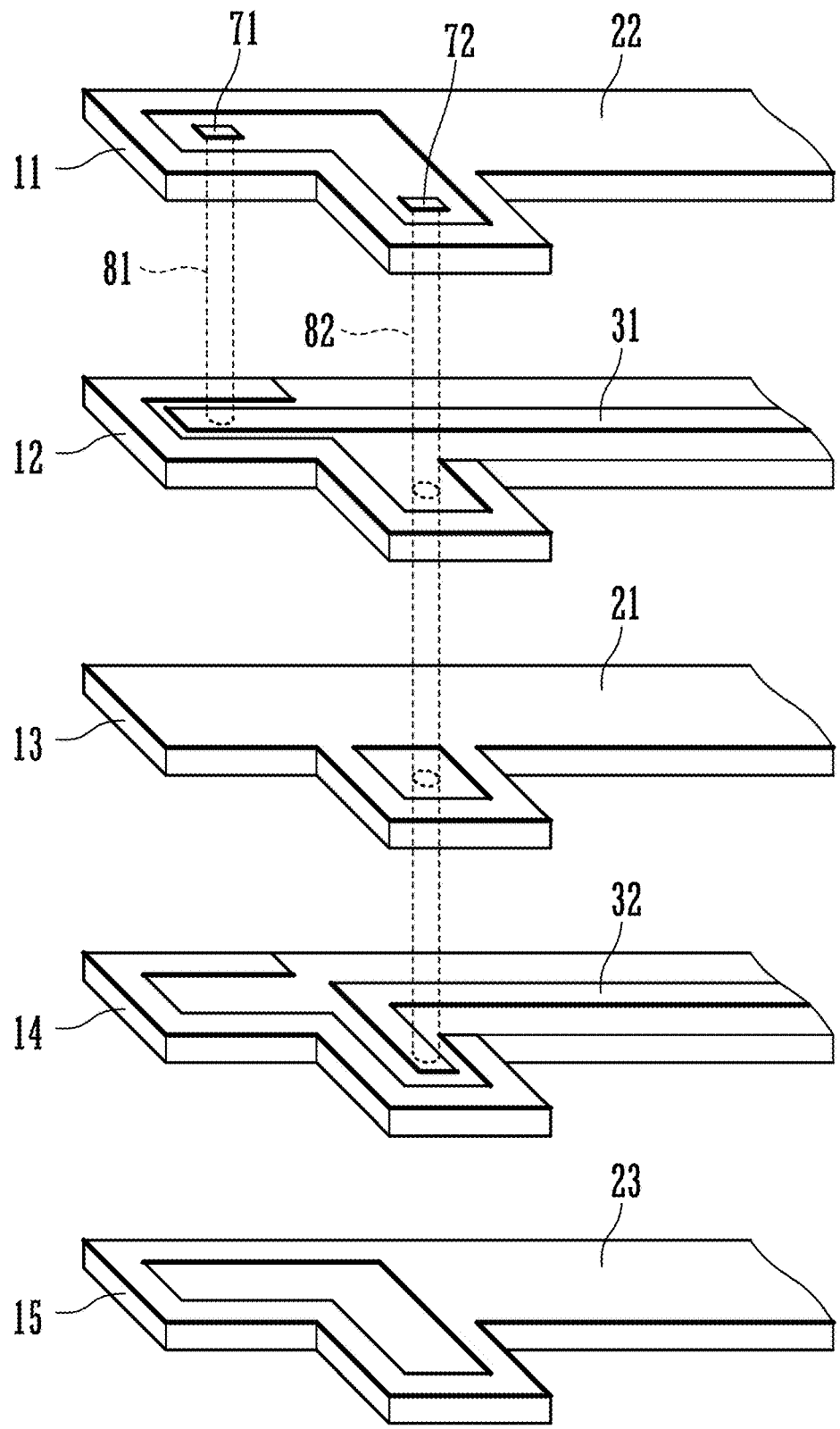
FIG. 19 is an exploded perspective view illustrating a region near one end portion of a cable according to a twelfth preferred embodiment of the present invention.
Figure 20:
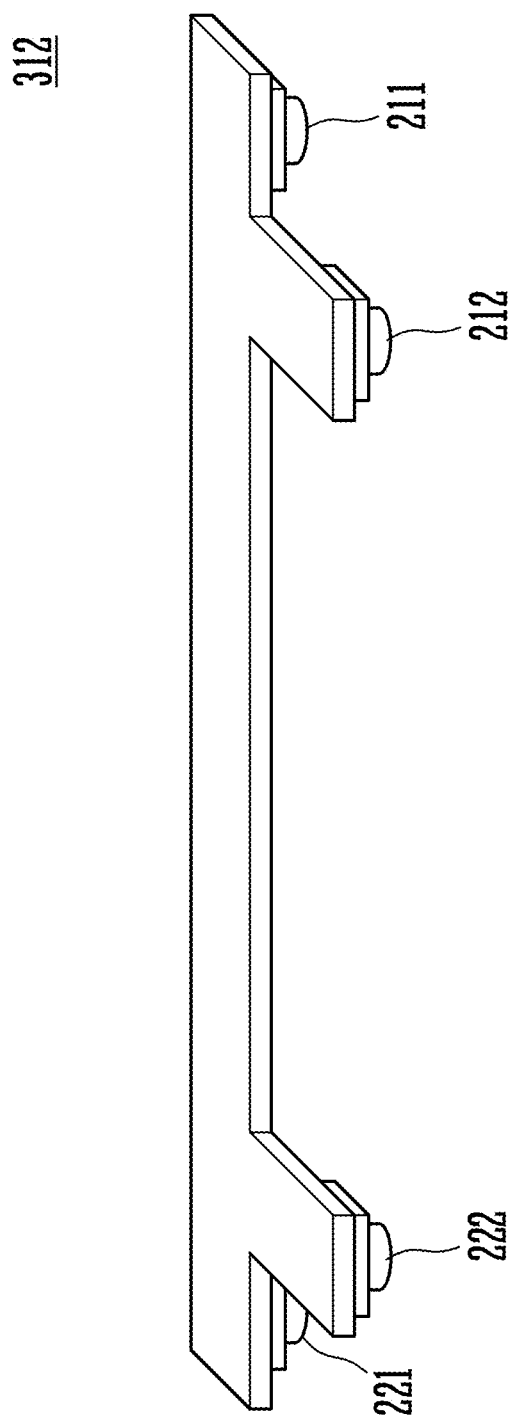
FIG. 20 is a perspective view of the cable according to the twelfth preferred embodiment of the present invention.
Figure 21:
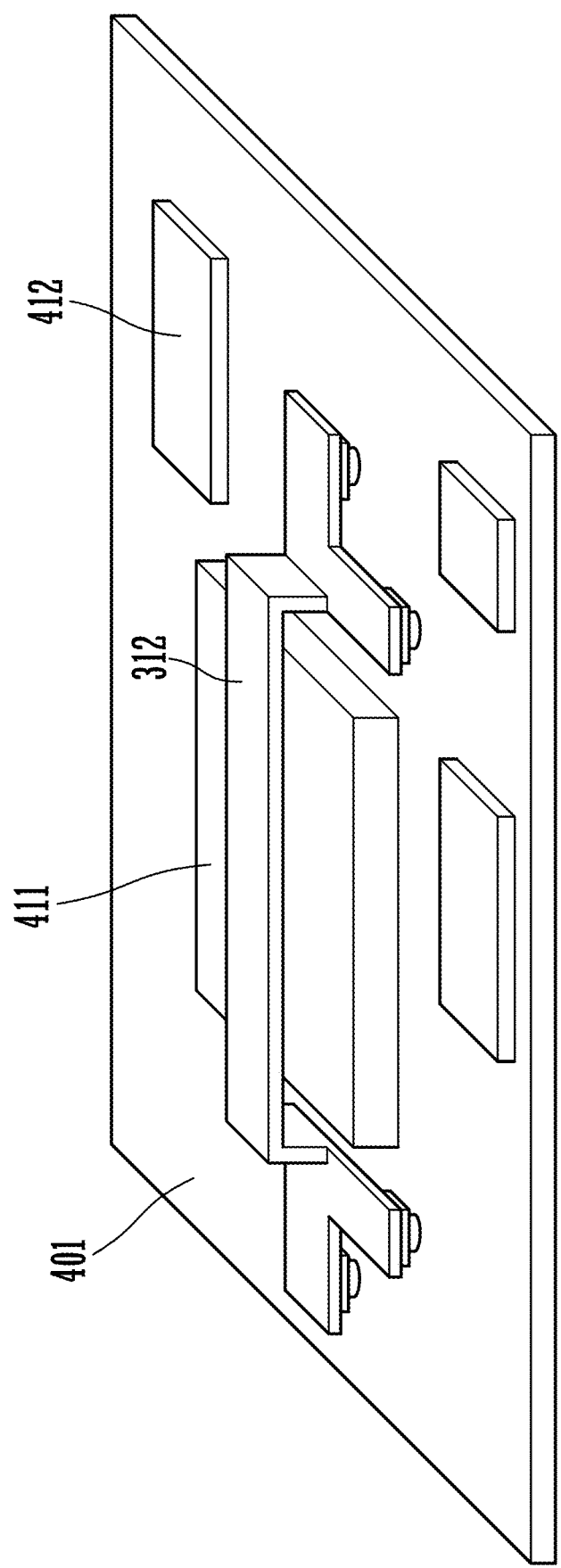
FIG. 21 illustrates a mounted state of the cable, according to the twelfth preferred embodiment of the present invention, to a circuit board.

FIG. 19 is an exploded perspective view illustrating a region near one end portion of a cable 312 according to the twelfth preferred embodiment. FIG. 20 is a perspective view of the cable 312, and FIG. 21 illustrates a mounted state of the cable 312 to a circuit board.

The cable 312 according to this preferred embodiment is defined by a transmission line that has a structure allowing a coaxial connector to be attached to an end portion of the transmission line, and by the coaxial connector. A basic configuration of the transmission line is similar to that of the transmission line described in each of the above preferred embodiments.

As shown in FIG. 19, a transmission line of the cable 312 includes a multilayer insulating body in which insulator layers 11, 12, 13, 14 and 15 are laminated. A first ground conductor pattern 21 is provided on the insulator layer 13, a second ground conductor pattern 22 is provided on the insulator layer 11, and a third ground conductor pattern 23 is provided on the insulator layer 15, respectively. A first signal conductor pattern 31 is provided on the insulator layer 12, and a second signal conductor pattern 32 is provided on the insulator layer 14, respectively.

Connector electrodes 71 and 72 are provided on the insulator layer 11. An interlayer connecting conductor 81 connecting the connector electrode 71 and an end portion of the first signal conductor pattern 31 is provided on or in the insulator layer 11. Furthermore, an interlayer connecting conductor 82 connecting the connector electrode 72 and an end portion of the second signal conductor pattern 32 is provided on or in each of the insulator layers 11, 12 and 13. Connector electrodes similar to the connector electrodes 71 and 72 are further provided on or in the other end portion of the cable 312.

As shown in FIG. 20, coaxial connectors 211, 212, 221 and 222 are disposed in end portions of the cable 312. The coaxial connector 211 is mounted to the connector electrode 71 and to the ground conductor pattern 22 around the connector electrode 71, which are illustrated in FIG. 19, and the coaxial connector 212 is mounted to the connector electrode 72 and to the ground conductor pattern around the connector electrode 72. A resist film preferably is provided on a surface layer of the cable 312 as the occasion requires.

As shown in FIG. 21, the cable 312 is mounted to a circuit board 401. A battery pack 411, an electronic component 412, etc. are also mounted to the circuit board 401. Because the cable 312 has flexibility, the cable 312 is able to be arranged to extend along other components, such as the battery pack 411, and other members.

Thirteenth Preferred Embodiment

A thirteenth preferred embodiment of the present invention represents an example of a cable that is a surface-mounted component.

Figure 22:
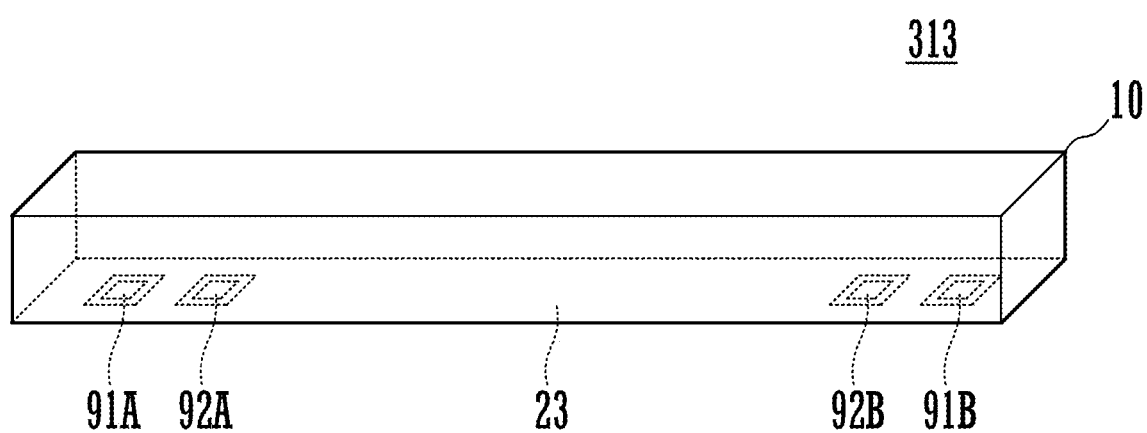
FIG. 22 is a perspective view of a cable according to a thirteenth preferred embodiment of the present invention.
Figure 23:
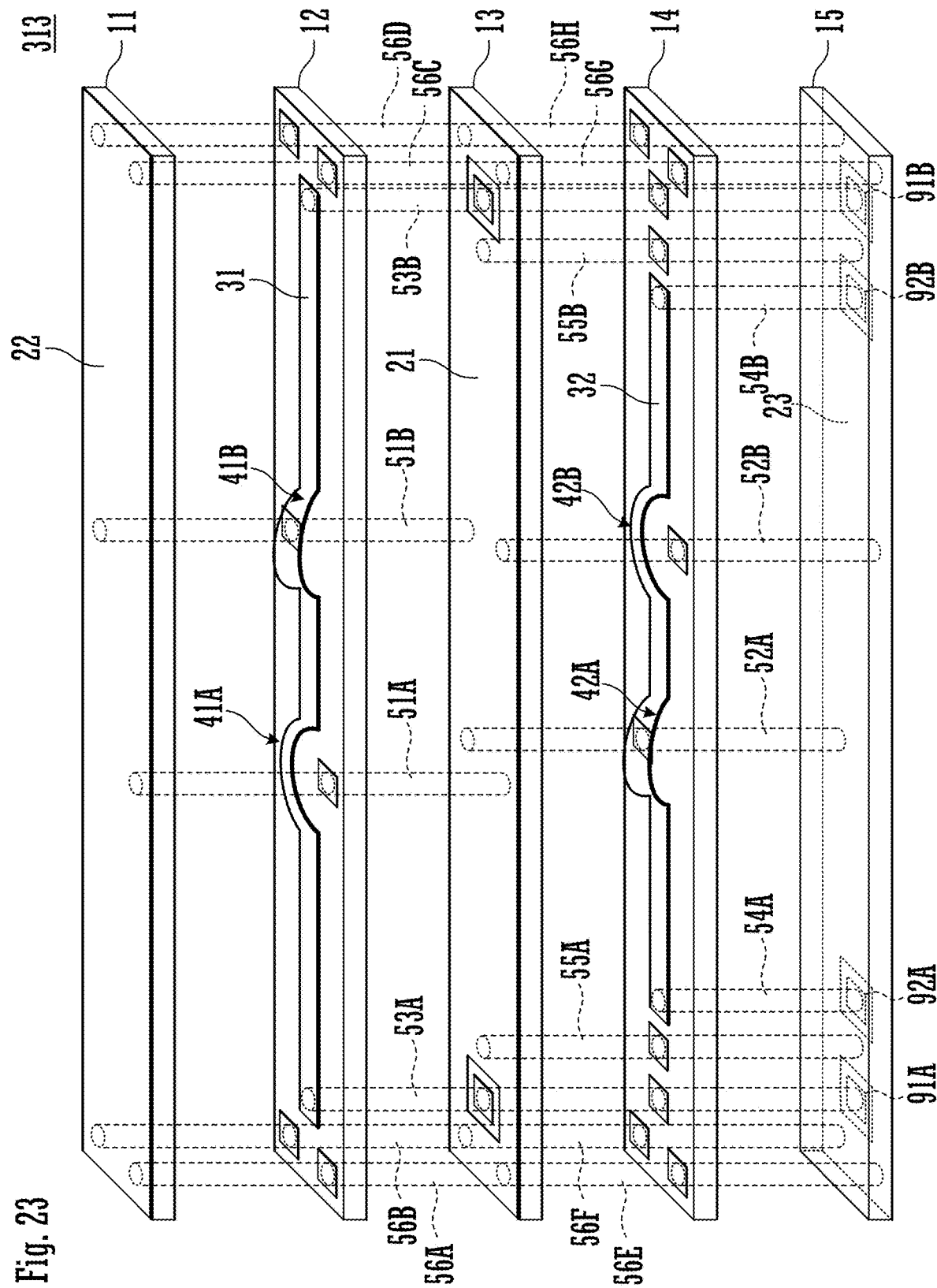
FIG. 23 is an exploded perspective view of the cable according to the thirteenth preferred embodiment of the present invention.

FIG. 22 is a perspective view of a cable 313 according to the thirteenth preferred embodiment. FIG. 23 is an exploded perspective view of the cable 313.

The cable 313 includes a multilayer insulating body 10 in which insulator layers 11, 12, 13, 14 and 15 are laminated. External terminal electrodes 91A, 91B, 92A and 92B adapted for surface-mounting are provided at a lower surface of the multilayer insulating body 10. The third ground conductor pattern 23 is exposed at the lower surface of the multilayer insulating body 10.

As shown in FIG. 23, a first ground conductor pattern 21 is provided on the insulator layer 13, a second ground conductor pattern 22 is provided on the insulator layer 11, and a third ground conductor pattern 23 is provided on the insulator layer 15, respectively. A first signal conductor pattern 31 is provided on the insulator layer 12, and a second signal conductor pattern 32 is provided on the insulator layer 14, respectively. First interlayer connecting conductors 51A and 51B are provided on or in each of the insulator layers 11 and 12. Similarly, second interlayer connecting conductors 52A and 52B are provided on or in each of the insulator layers 13 and 14.

The first signal conductor pattern 31 includes first bypassing pattern portions 41A and 41B that bypass the first interlayer connecting conductors 51A and 51B, respectively. The second signal conductor pattern 32 includes second bypassing pattern portions 42A and 42B that bypass the second interlayer connecting conductors 52A and 52B, respectively.

A first end of the first signal conductor pattern 31 is connected to the external terminal electrode 91A through an interlayer connecting conductor 53A, and a second end of the first signal conductor pattern 31 is connected to the external terminal electrode 91B through an interlayer connecting conductor 53B.

Furthermore, a first end of the second signal conductor pattern 32 is connected to the external terminal electrode 92A through an interlayer connecting conductor 54A, and a second end of the second signal conductor pattern 32 is connected to the external terminal electrode 92B through an interlayer connecting conductor 54B.

The first ground conductor pattern 21 is connected to the second ground conductor pattern 22 through interlayer connecting conductors 51A, 51B, 56A, 56B, 56C and 56D.

The first ground conductor pattern 21 is further connected to the third ground conductor pattern 23 through interlayer connecting conductors 52A, 52B, 56E, 56F, 56G, 56H, 55A and 55B.

Land patterns are provided on or in the circuit board such that the land patterns are able to oppose to the external terminal electrodes 91A, 91B, 92A and 92B of the cable 313 illustrated in FIG. 22. The external terminal electrodes 91A, 91B, 92A and 92B are soldered to those land patterns such that the cable 313 is surface-mounted to the circuit board.

Fourteenth Preferred Embodiment

A fourteenth preferred embodiment of the present invention represents an example of a cable that is a surface-mounted component. The fourteenth preferred embodiment is different from the thirteenth preferred embodiment in a structure of a cable lower surface.

Figure 24:
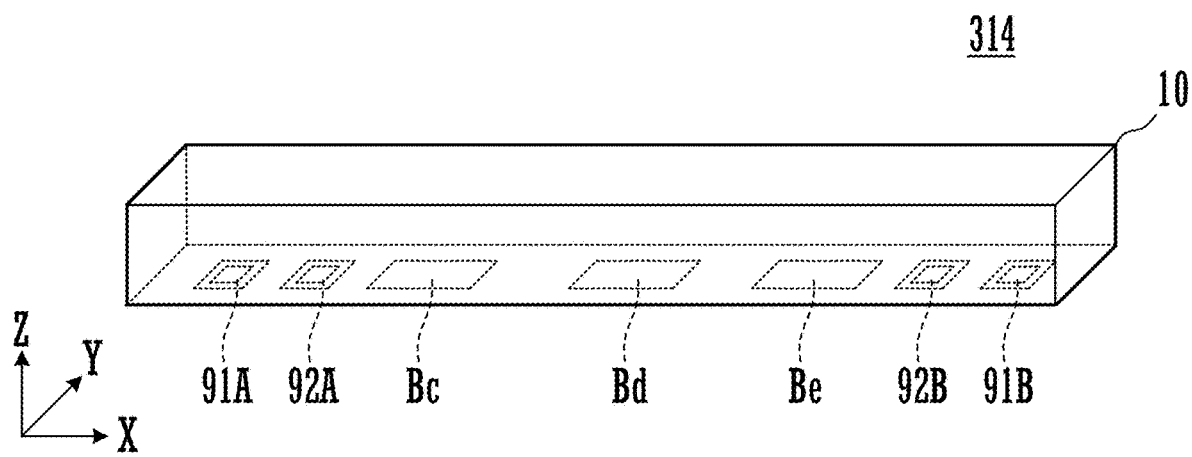
FIG. 24 is a perspective view of a cable according to a fourteenth preferred embodiment of the present invention.
Figure 25:
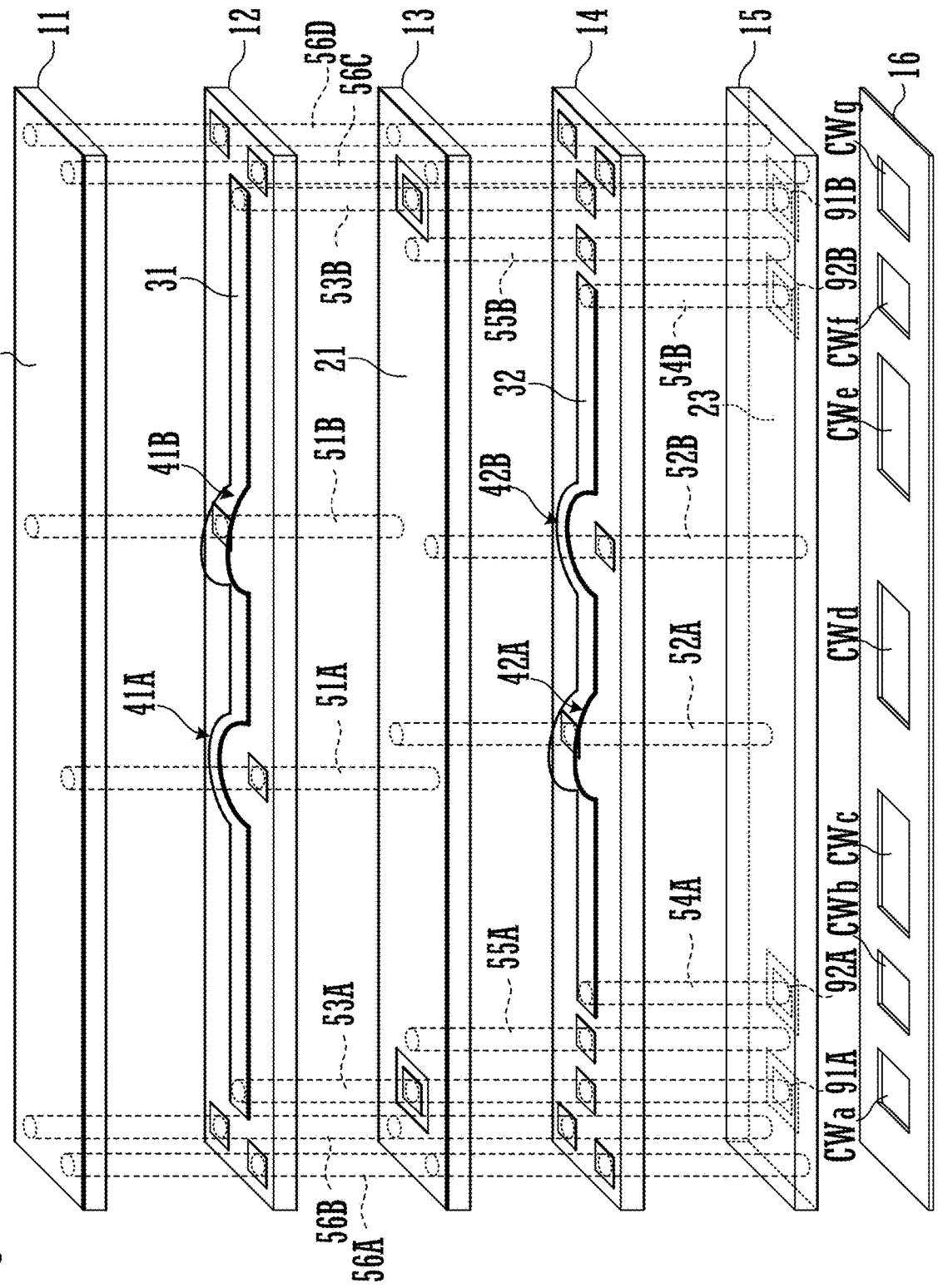
FIG. 25 is an exploded perspective view of the cable according to the fourteenth preferred embodiment of the present invention.

FIG. 24 is a perspective view of a cable 314 according to the fourteenth preferred embodiment. FIG. 25 is an exploded perspective view of the cable 314.

The cable 314 is different from the cable 313, described in the thirteenth preferred embodiment, in including an insulator layer 16 appearing in FIG. 25. Openings CWa to CWg are provided in the insulator layer 16. The external terminal electrodes 91A, 92A, 92B and 91B are exposed through the openings CWa, CWb, CWf and CWg, respectively. Furthermore, the third ground conductor pattern 23 is exposed through the openings CWc, CWd and CWe. In FIG. 24, joining patterns Bc, Bd and Be represent portions where the third ground conductor pattern 23 is exposed.

The cable 314 including the external terminal electrodes 91A, 91B, 92A and 92B and the joining patterns Bc, Bd and Be, which are provided at the lower surface of the multilayer insulating body 10 and which are adapted for surface-mounting, are obtained with the structure described above.

Figure 26A:
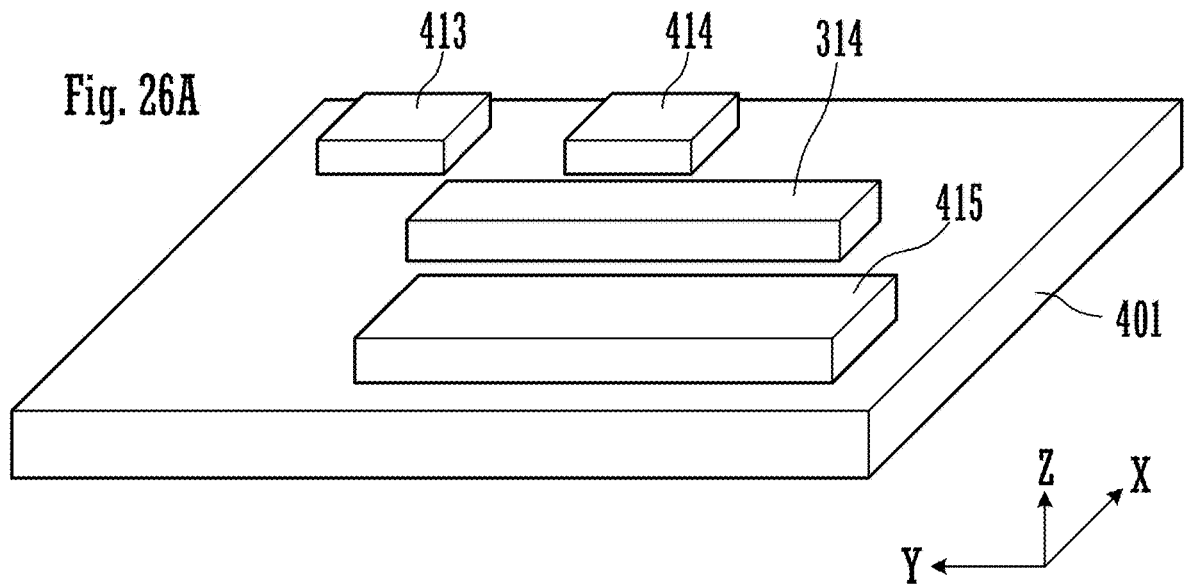
FIG. 26A is a perspective view illustrating a mounted state of the cable, according to the fourteenth preferred embodiment of the present invention, to a circuit board.
Figure 26B:
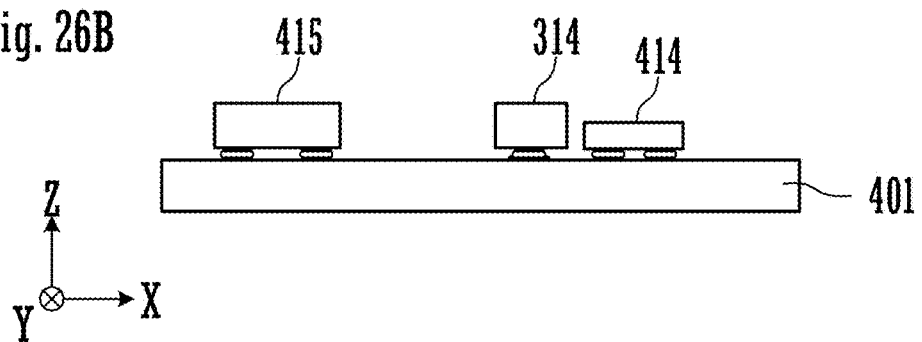
FIG. 26B is a right side view of the circuit board that is oriented as illustrated in FIG. 26A.
Figure 27A:
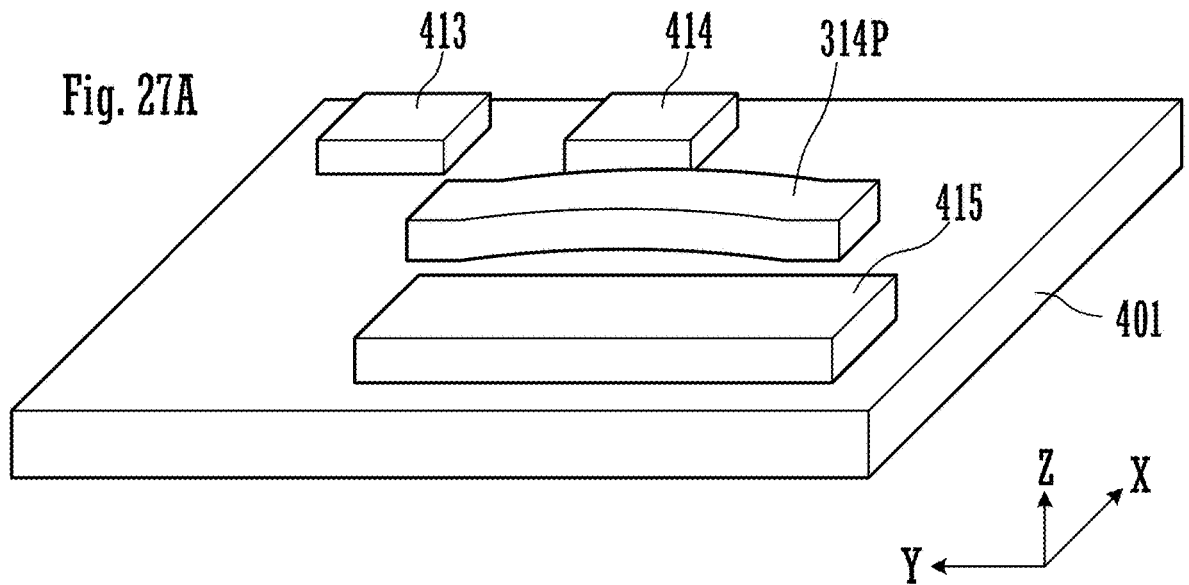
FIG. 27A is a perspective view illustrating a mounted state of a cable, as a comparative example, to a circuit board.

FIG. 26A is a perspective view illustrating a mounted state of the cable 314 to the circuit board, and FIG. 26B is a right side view of the circuit board that is oriented as illustrated in FIG. 26A. FIG. 27A is a perspective view illustrating a mounted state of a cable 314P, as a comparative example, to a circuit board, and FIG. 27B is a right side view of the circuit board that is oriented as illustrated in FIG. 27A.

Lands used for mounting various surface-mounted components are provided on a circuit board 401. After printing a cream solder to each of the lands, surface-mounted components 413, 414 and 415 and the cable 314 are mounted to the lands. Thereafter, the circuit board 401 is passed through a reflow furnace, and those components are soldered onto the circuit board 401.

Figure 27B:
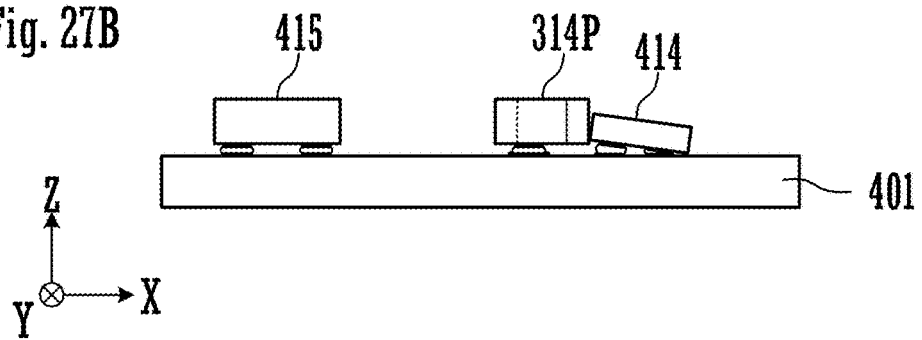
FIG. 27B is a right side view of the circuit board that is oriented as illustrated in FIG. 27A.

In the comparative cable 314P, the conductor patterns in the multilayer insulating body are asymmetric with respect to a lengthwise direction of the multilayer insulating body (i.e., a Y-axis direction denoted in FIGS. 27A and 27B). In the cable 314 according to this preferred embodiment, the conductor patterns in the multilayer insulating body are symmetric with respect to a Y-axis direction denoted in FIGS. 26A and 26B. Because of the above-mentioned asymmetry with respect to an axis in the lengthwise direction, the comparative cable 314P is more apt to deform in the step of laminating the insulator layers and after the lamination. In particular, if the comparative cable 314P flexes in an X-axis direction, there is a possibility that, when the cable 314P is mounted to the circuit board 401, the cable 314P comes into contact with the surface-mounted component 414, which is positioned nearby, thus displacing or tilting the surface-mounted component 414.

On the other hand, because of the above-mentioned symmetry with respect to an axis in the lengthwise direction, the comparative cable 314 according to this preferred embodiment is harder to deform in the step of laminating the insulator layers and after the lamination. Accordingly, when the cable 314 is mounted to the circuit board 401, the cable 314 is prevented from coming into contact with the surface-mounted component 414, which is positioned nearby. Hence the above-mentioned problem hardly occurs.

While the above preferred embodiments have been described, by way of example, in connection with the case where the transmission line and the cable are each linear, the transmission line and the cable may include a curved portion midway or near an end portion thereof.

The description of the above preferred embodiments is intended to be illustrative and not to be limitative in all respects. The above preferred embodiments can be apparently modified and altered by those skilled in the art as appropriate. For example, partial replacement or combination of the individual constituent elements described in the different preferred embodiments can be made. The scope of the present invention is defined by the claims rather than the above preferred embodiments. The scope of the present invention is intended to include any kinds of alterations that are equivalent to and fall within the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
    a multilayer insulating body including a plurality of insulator layers laminated one above another;
    a conductor pattern that is located inside the multilayer insulating body along the plurality of insulator layers; wherein
    the conductor pattern includes a first signal conductor pattern, a second signal conductor pattern arranged on a different layer from the first signal conductor pattern, and a ground conductor pattern;
    the plurality of insulator layers include a plurality of first insulator layers and a plurality of second insulator layers;
    effective dielectric constants of the plurality of first insulator layers are lower than effective dielectric constants of the plurality of second insulator layers;
    the plurality of first insulator layers and the plurality of second insulator layers are arranged in a region between the first signal conductor pattern and the second signal conductor pattern, and the first insulator layers are dispersedly arranged in a stacking direction;
    the ground conductor pattern is disposed between an insulator layer of the plurality of insulator layers on which the first signal conductor pattern is provided and an insulator layer of the plurality of insulator layers on which the second signal conductor pattern is provided; and
    the plurality of first insulator layers are located between the ground conductor pattern and the first signal conductor pattern.

2. The transmission line according to claim 1, wherein
    the ground conductor pattern includes a second ground conductor pattern, a first ground conductor pattern, and a third ground conductor pattern;
    the second ground conductor pattern, the first ground conductor pattern and the third ground conductor pattern are arranged in the direction of the lamination along different insulator layers among the plurality of insulator layers; and
    the first signal conductor pattern is disposed between the first ground conductor pattern and the second ground conductor pattern; and
    the second signal conductor pattern is disposed between the first ground conductor pattern and the third ground conductor pattern.

3. The transmission line according to claim 2, wherein each of the plurality of first insulator layers between the first signal conductor pattern and the plurality of second signal conductor pattern is interposed between the second insulator layers in the stacking direction.

4. The transmission line according to claim 3, wherein
    a bonding pattern is provided;
    the bonding pattern is parallel or substantially parallel to the plurality of insulator layers;
    the bonding pattern is provided on a lower surface of the multilayer insulating body; and
    the bonding pattern is electrically connected to the conductor pattern.

5. A electric device comprising:
    the transmission line according to claim 4 and a circuit board; wherein
    the transmission line is surface-mounted on the circuit board together with other surface-mounted components.

6. The transmission line according to claim 2, wherein
    a bonding pattern is provided;
    the bonding pattern is parallel or substantially parallel to the plurality of insulator layers;
    the bonding pattern is provided on a lower surface of the multilayer insulating body; and
    the bonding pattern is electrically connected to the conductor pattern.

7. A electric device comprising:
    the transmission line according to claim 6 and a circuit board; wherein
    the transmission line is surface-mounted on the circuit board together with other surface-mounted components.

8. The transmission line according to claim 1, wherein each of the plurality of first insulator layers between the first signal conductor pattern and the second signal conductor pattern is interposed between the plurality of second insulator layers in the stacking direction.

9. The transmission line according to claim 8, wherein
    a bonding pattern is provided;
    the bonding pattern is parallel or substantially parallel to the plurality of insulator layers;
    the bonding pattern is provided on a lower surface of the multilayer insulating body; and
    the bonding pattern is electrically connected to the conductor pattern.

10. A electric device comprising:
    the transmission line according to claim 9 and a circuit board; wherein
    the transmission line is surface-mounted on the circuit board together with other surface-mounted components.

11. The transmission line according to claim 1, wherein
    a bonding pattern is provided;
    the bonding pattern is parallel or substantially parallel to the plurality of insulator layers;
    the bonding pattern is provided on a lower surface of the multilayer insulating body; and
    the bonding pattern is electrically connected to the conductor pattern.

12. A electric device comprising:
    the transmission line according to claim 11 and a circuit board; wherein
    the transmission line is surface-mounted on the circuit board together with other surface-mounted components.

13. The transmission line according to claim 1, wherein the transmission line includes a bent portion.

14. The transmission line according to claim 13, wherein
    the ground conductor pattern includes an upper surface and a lower surface arranged in the stacking direction;
    the upper surface contacts one of the plurality of first insulator layers; and
    the lower surface contacts one of the plurality of second insulator layers.

* * * * *